United States Patent
Chen et al.

(10) Patent No.: US 9,627,022 B2
(45) Date of Patent: Apr. 18, 2017

(54) DOUBLE PUMPED MEMORY TECHNIQUES

(71) Applicant: ARM Limited, Cambridge (GB)

(72) Inventors: Andy Wangkun Chen, Austin, TX (US); Hsin-Yu Chen, Austin, TX (US); Sabarish Ittamveetil, Austin, TX (US); Yew Keong Chong, Austin, TX (US); Indranil Basu, Bangalore (IN); Vikash, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/836,657

(22) Filed: Aug. 26, 2015

(65) Prior Publication Data
US 2016/0064054 A1    Mar. 3, 2016

(30) Foreign Application Priority Data
Aug. 26, 2014    (GB) .................................. 1415075.9

(51) Int. Cl.
*G11C 8/18* (2006.01)
*G11C 5/02* (2006.01)
(Continued)

(52) U.S. Cl.
CPC ................ *G11C 8/18* (2013.01); *G11C 5/025* (2013.01); *G11C 7/106* (2013.01); *G11C 7/1075* (2013.01);
(Continued)

(58) Field of Classification Search
CPC ......... G11C 8/18; G11C 5/025; G11C 7/1075; G11C 8/12; G11C 7/222; G11C 7/1087; G11C 7/106; G11C 7/062; G06F 13/28
See application file for complete search history.

(56) References Cited

U.S. PATENT DOCUMENTS 6,253,297 B1 *    6/2001    Chauvel ................. G06F 13/28
                                                        711/154
6,282,131 B1      8/2001    Roy
(Continued)

FOREIGN PATENT DOCUMENTS

JP      S63100552 A      5/1988
JP      H05334183 A      12/1993

OTHER PUBLICATIONS

UKIPO Search Report; GB 1415075.9; Feb. 24, 2015.

*Primary Examiner* — Richard Elms
*Assistant Examiner* — Ajay Ojha
(74) *Attorney, Agent, or Firm* — Pramudji Law Group PLLC; Ari Pramudji

(57) ABSTRACT

A memory device and method of operating a memory device are provided. The memory device comprises global control circuitry configured to receive a clock signal for the memory device and the memory device is configured to perform a double memory access in response to a single edge of the clock signal. A first internal clock pulse for a first access of the double memory access and a second internal clock pulse for a second access of the double memory access are generated in response to the single edge of the clock signal. The global control circuitry generates a comparison signal in dependence on a comparison between a first bank indicated by the first access and a second bank indicated by the second access, and local bank control circuitry of the second bank is configured to generate the second internal clock pulse in dependence on the comparison signal.

33 Claims, 25 Drawing Sheets

(51) Int. Cl.
*G11C 7/22* (2006.01)
*G11C 7/10* (2006.01)
*G11C 8/12* (2006.01)
G11C 7/06 (2006.01)
G06F 13/28 (2006.01)

(52) U.S. Cl.
CPC ............ *G11C 7/1087* (2013.01); *G11C 7/222* (2013.01); *G11C 8/12* (2013.01); *G06F 13/28* (2013.01); *G11C 7/062* (2013.01)

(56) References Cited

U.S. PATENT DOCUMENTS

| | | | |
|---|---|---|---|
| 2002/0002650 A1 | 1/2002 | Christenson | |
| 2010/0103762 A1* | 4/2010 | Tzou | G11C 8/18 365/230.03 |
| 2010/0214857 A1 | 8/2010 | Hsu et al. | |
| 2012/0243301 A1* | 9/2012 | Maheshwari | G11C 11/408 365/154 |
| 2013/0088927 A1 | 4/2013 | Lum et al. | |
| 2014/0056093 A1 | 2/2014 | Tran et al. | |
| 2014/0085993 A1 | 3/2014 | Tao et al. | |
| 2016/0055889 A1* | 2/2016 | Bhatia | G11C 7/222 365/189.05 |

\* cited by examiner

DOUBLE PUMPED MEMORY TECHNIQUES

CROSS-REFERENCE TO RELATED APPLICATIONS

This application claims priority to United Kingdom Patent Application No. GB 1415075.9, filed Aug. 26, 2014 which is titled DOUBLE PUMPED MEMORY TECHNIQUES and the entire disclosure of which is herein incorporated by reference.

TECHNICAL FIELD

The present disclosure relates to data processing. More particularly it relates to double pumping techniques in a memory device.

BACKGROUND

It is known for a memory to be configured for double pumped operation in which the data rate (i.e. the rate at which data may be written to or read from the memory) is twice the clock frequency. Various advantages associated with this double pumping technique are known, not least of which is the doubled data transmission rate with respect to a single pumped configuration.

Adapting a memory to the double pumped is however not without its technical challenges, since not only must the memory be configured to operate at an internal clock frequency which is twice the external clock frequency it receives, various other different aspects of the configuration and operation of the memory can be affected.

The present techniques are concerned with addressing various technical challenges which arise in the context of configuring a memory device for double pumped operation.

SUMMARY

Viewed from a first aspect, the present techniques provide a memory device comprising:

global control circuitry configured to receive a clock signal for the memory device, the memory device configured to perform a double memory access in response to a single edge of the clock signal, wherein the memory device is configured to generate a first internal clock pulse for a first access of the double memory access and a second internal clock pulse for a second access of the double memory access in response to the single edge of the clock signal, wherein the global control circuitry is configured to generate a comparison signal in dependence on a comparison between a first bank indicated by the first access and a second bank indicated by the second access, and wherein the local bank control circuitry of the second bank is configured to generate the second internal clock pulse in dependence on the comparison signal.

In some embodiments the memory device comprises a plurality of banks, each bank having associated local bank control circuitry.

In some embodiments the local bank control circuitry of the second bank is configured to generate a first edge of the second internal clock pulse in dependence on a reset signal generated by the local bank control circuitry of the first bank and without dependence on signals generated by local bank control circuitry of banks of the plurality of banks which are not the first bank, if the comparison signal indicates that the first bank indicated matches the second bank indicated.

In some embodiments the reset signal generated by the local bank control circuitry of the first bank comprises a second edge of the first internal clock pulse generated by the local bank control circuitry of the first bank.

In some embodiments the local bank control circuitry of the first bank is configured to generate the first edge of the second internal clock pulse after a predetermined delay after the second edge of the first internal clock pulse.

In some embodiments the local bank control circuitry of the second bank is configured to generate a first edge of the second internal clock pulse in dependence on the single edge of the clock signal and without dependence on signals generated by local bank control circuitry of any banks of the plurality of banks, if the comparison signal indicates that the first bank indicated does not match the second bank indicated.

In some embodiments the local bank control circuitry of the second bank is configured to generate the first edge of the second internal clock pulse without dependence on reset signals generated by local bank control circuitry of banks of the plurality of banks which are not the second bank.

In some embodiments the local bank control circuitry of the second bank is configured to generate the first edge of the second internal clock pulse after a predetermined delay after the single edge of the clock signal.

In some embodiments the predetermined delay is set such that the first edge of the second internal clock pulse precedes the second edge of the first internal clock pulse.

In some embodiments the global control circuitry is configured to receive a first access enable indication and a second access enable signal and, when the first access enable indication indicates that the first access is not enabled, to generate the comparison signal indicating that the first bank indicated does not match the second bank indicated.

In some embodiments the global control circuitry is configured to receive a first access enable indication and a second access enable signal and, when the second access enable indication indicates that the second access is not enabled, to suppress generation of the second internal clock pulse.

In some embodiments the memory device further comprises:

global reset signal generation circuitry configured to generate a global reset signal for the memory device, wherein the memory device is configured to generate the second internal clock pulse after an edge of the global reset signal; and one or more banks, wherein the memory device is configured such that only one bank of the one or more banks can be accessed at a time, wherein the global reset signal generation circuitry comprises, for each bank of the one or more banks, a combination logic circuitry block, the combination circuitry logic block having a local reset input, a concatenation input, a first concatenation output node and a second concatenation output node, wherein each combination logic circuitry block of the one or more banks is coupled to only one output path and only one of the first concatenation output node and the second concatenation output node has a functional connection and the functional connection is to the only one output path, wherein if the memory device has only one bank, the output path is connected to the first concatenation output node and provides the global reset signal for the memory device, and wherein if the memory device has more than one bank, the combination logic circuitry blocks for each bank of the more than one bank are connected in a concatenation and the output path from a last combination logic circuitry block in the concatenation provides the global reset signal for the memory device.

In some embodiments the memory device has only one bank and the local reset input is coupled to a local reset signal generated in the bank and the concatenation input is tied to a fixed input value.

In some embodiments the memory device has more than one bank and for a first combination logic circuitry block in the concatenation the local reset input is coupled to a local reset signal generated in a first bank comprising a first combination logic circuitry block in the concatenation and the concatenation input is tied to a fixed input value.

In some embodiments the memory device has two banks and for a second combination logic circuitry block in the concatenation the concatenation input is connected to the second concatenation output node of the first combination logic circuitry block in the concatenation.

In some embodiments the memory device has more than two banks and a connection forming the concatenation between each combination logic circuitry block in the concatenation is alternately:

from the second concatenation output node of a previous combination logic circuitry block in the concatenation to the concatenation input of a next combination logic circuitry block in the concatenation; and from the first concatenation output node of the previous combination logic circuitry block in the concatenation to the concatenation input of the next combination logic circuitry block in the concatenation.

In some embodiments for the combination logic circuitry block of each bank of the one or more banks:

the local reset input is connected to an input of an inverter and to a first input of a NAND gate;

an output of the inverter provides a first input to a NOR gate;

the concatenation input provides a second input of the NAND gate and the second input of the NOR gate; and either the output of the NOR gate is connected to the first concatenation output node or the output of the NAND gate is connected to the second concatenation output node to provide the functional connection to the only one output path.

In some embodiments the memory device further comprises a multiplexer configured to output a selected address of a first address of the first access and a second address of the second access in dependence on a selection signal and to provide the selected address for a respective access of the double memory access, wherein the selection signal is configured to toggle after the global reset signal toggles.

In some embodiments the memory device comprises a single-ported bank and wherein the global control circuitry further comprises:

a multiplexer configured to receive a first data item for the first access and a second data item for the second access and is configured to output the first data item when a multiplexer selection signal has a first value and the second data item when the multiplexer selection signal has a second value;

a latch configured to receive the second data item and to provide the second data item to the multiplexer in dependence on a latch clock; and latch clock generation circuitry configured to generate the latch clock in dependence on the clock signal and the multiplexer selection signal.

In some embodiments the latch clock generation circuitry is configured to generate a first edge of the latch clock in response to the single edge of the clock signal.

In some embodiments the latch clock generation circuitry is configured to generate a second edge of the latch clock in response to the multiplexer selection signal switching from the first value to the second value.

In some embodiments the latch clock generation circuitry is configured to generate the second edge of the latch clock after a first edge of the second internal clock pulse.

In some embodiments the memory device further comprises multiplexer selection signal generation circuitry configured to generate the multiplexer selection signal having the second value a predetermined delay after a first edge of the first internal clock pulse.

In some embodiments the multiplexer selection signal generation circuitry is configured to return the multiplexer selection signal to having the first value a predetermined delay after a first edge of the second internal clock pulse.

In some embodiments the global control circuitry further comprises an output latch configured to receive an output data item selected by the multiplexer and configured to provide the output data item to the single-ported bank in response to the first internal clock pulse for the first access of the double memory access and in response to the second internal clock pulse for the second access of the double memory access.

In some embodiments the output latch is configured provide the output data item to the single-ported bank in response to first edges of the first internal clock pulse and the second internal clock pulse respectively.

In some embodiments the memory device comprises more than one bank arranged in a set of banks and wherein access to the set of banks is single-ported.

In some embodiments the first data item for the first access is a first address and the second data item for the second access is a second address.

In some embodiments the memory device comprises:

single-ported data storage circuitry comprising a data output latch;

dual output latching circuitry comprising a first supplementary data output latch and a second supplementary data output latch, wherein the first supplementary data output latch and the second supplementary data output latch are each configured to receive and to latch an output of the data output latch; and dual output control circuitry configured, in response to the single edge of the clock signal, to cause the output of the data latch to be latched by the first supplementary data output latch and subsequently to cause the output of the data latch to be latched by the second supplementary data output latch.

In some embodiments the single-ported data storage circuitry comprises sense amplifier circuitry configured to be active when a sense amplifier enable signal is asserted, and wherein the dual output control circuitry is configured to:

activate the first supplementary data output latch in response to the single edge of the clock signal;

deactivate the first supplementary data output latch and activate the second supplementary data output latch in response to a first instance of a selected type of edge of the sense amplifier enable signal which follows the single edge of the clock signal; and deactivate the second supplementary data output latch in response to a next instance of the selected type of edge of the sense amplifier enable signal.

In some embodiments the single-ported data storage circuitry comprises sense amplifier circuitry configured to be active when a sense amplifier enable signal is asserted, wherein the dual output control circuitry is configured to generate an internal clock signal for the second supplementary data output latch, and wherein the dual output control circuitry is configured to generate a first type of edge of the internal clock signal in response to the single edge of the clock signal and a second type of edge of the internal clock signal in response to a first instance of a selected type of edge of the sense amplifier enable signal which follows the single edge of the clock signal.

In some embodiments the single-ported data storage circuitry comprises a data input latch, and further comprises:

dual scan input latching circuitry configured to provide a scan input in a data input latch, the dual scan input latching circuitry comprising:

a scan input multiplexer configured to receive a first scan data value and a second scan data value, and configured to output to the data input latch the first scan data value when a scan multiplexer selection signal has a first value and the second scan data value when the multiplexer selection signal has a second value; and a scan input latch configured to receive the second scan data value and to provide the second scan data value to the scan input multiplexer in dependence on a scan input latch clock.

In some embodiments the memory device further comprises scan input latch clock generation circuitry configured to generate a first scan pulse and a second scan pulse of the scan latch clock in response to the single edge of the clock signal, wherein the scan input latch is configured to provide the second scan data value to the scan input multiplexer in response to the second scan pulse.

Viewed from a second aspect the present techniques provide a method of operating a memory device comprising a plurality of banks, each bank having associated local bank control circuitry, the method comprising the steps of:

receiving a clock signal for the memory device;

generating a first internal clock pulse for a first access of a double memory access and a second internal clock pulse for a second access of the double memory access in response to a single edge of the clock signal;

generating a comparison signal in dependence on a comparison between a first bank of the plurality of backs indicated by the first access and a second bank of the plurality of banks indicated by the second access; and generating, in the local bank control circuitry of the second bank, the second internal clock pulse in dependence on the comparison signal.

Viewed from a third aspect the present techniques provide a memory device comprising:

a plurality of banks each bank having associated local bank control circuitry;

means for receiving a clock signal for the memory device;

means for generating a first internal clock pulse for a first access of a double memory access and a second internal clock pulse for a second access of the double memory access in response to a single edge of the clock signal;

means for generating a comparison signal in dependence on a comparison between a first bank of the plurality of backs indicated by the first access and a second bank of the plurality of banks indicated by the second access; and means for generating, in the local bank control circuitry of the second bank, the second internal clock pulse in dependence on the comparison signal.

Viewed from a fourth aspect there is provided a computer-readable storage medium on which are stored in a non-transient fashion computer-readable instructions configured to control a memory compiler to generate a layout instance of a memory device according to any preceding aspect.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
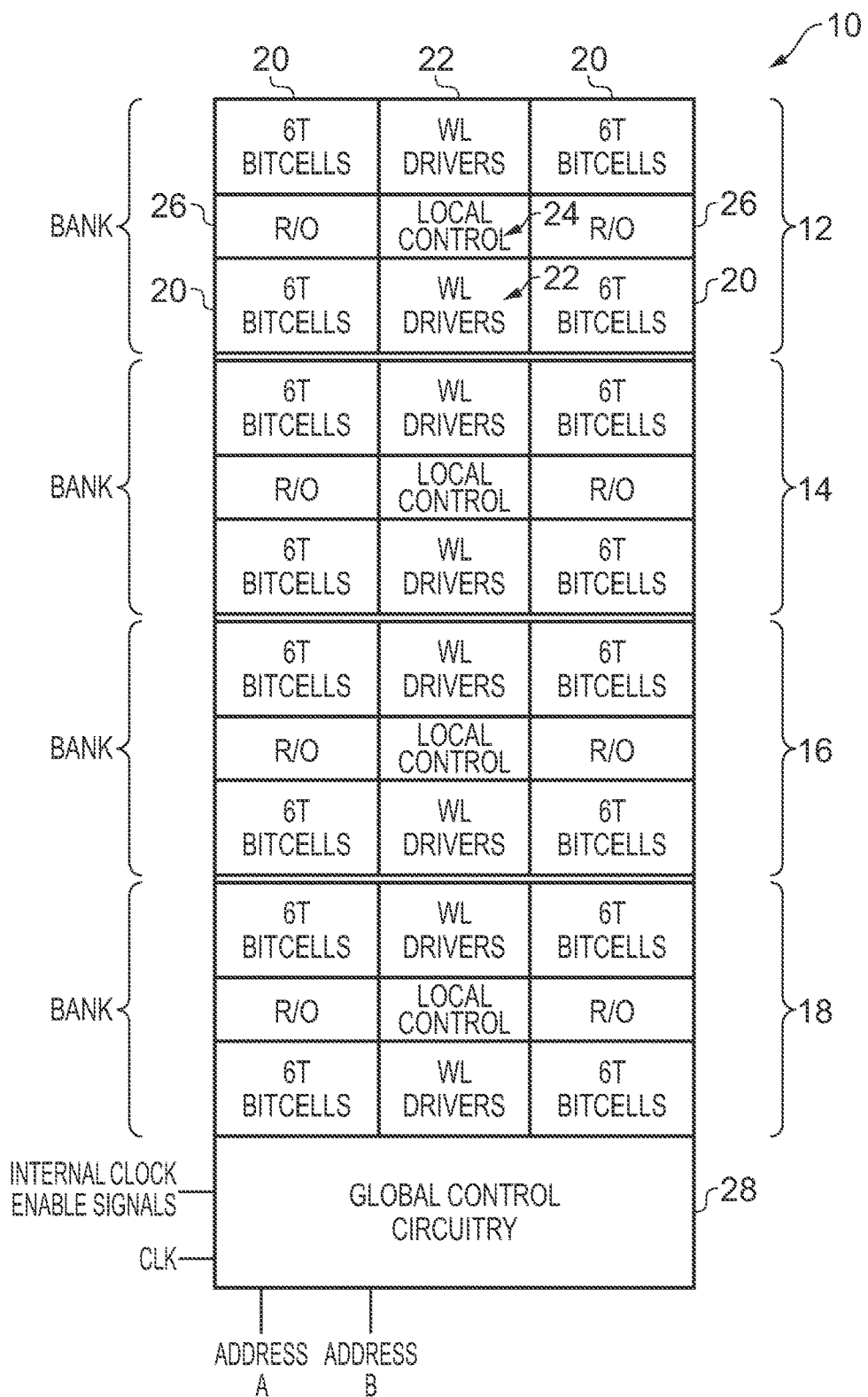
FIG. 1 schematically illustrates a memory device in one embodiment.

FIG. 1 schematically illustrates a memory device 10 in one embodiment. The memory device 10 generally comprises a single-ported set of four banks 12, 14, 16, 18, each bank having a number of 6T SRAM bit cells, Each bank is generally formed of the 6T bit cells 20, word line driver circuitry 22, readout circuitry 26 and local control circuitry 24. The memory device 10 further comprises global control circuitry 28 configured to provide overall control of the memory device 10. Moreover, according to the present techniques the global control circuitry 28 is configured to double pump memory accesses to the set of four banks, 12, 14, 16, 18 in that a double memory access is performed in response to a single edge of the clock signal CLK which it receives. Moreover the set of four banks are single-ported, yet the global control circuitry 28 is arranged to provide peripheral logic which supports the memory device being (externally) treated essentially as a double-ported memory device. Various aspects of the configuration of the memory device to allow this double pumping and double porting to be carried out will be described with reference to the following figures.

Figure 2:
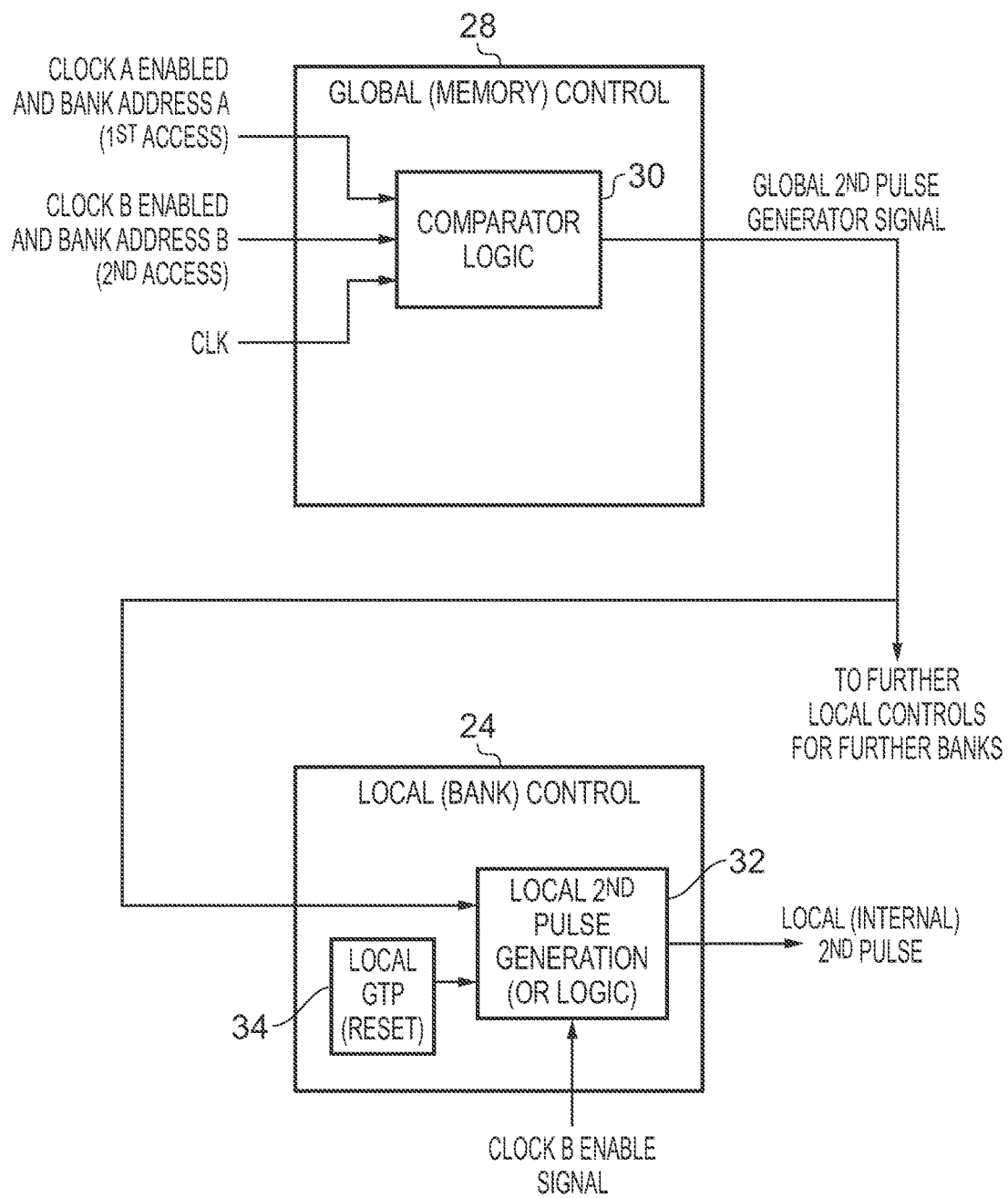
FIG. 2 schematically illustrates circuitry for generating a second internal clock pulse in one embodiment.

FIG. 2 schematically illustrates more detail of one aspect of the global control circuitry 28 and the local control circuitry 24 in each bank. This aspect relates to the generation of first and second internal clock pulses for timing the first and second accesses of the double memory access which the memory device 10 is configured to perform in response to a single edge (in this embodiment the rising edge) of the clock signal (CLK). Previously, a straightforward implementation to ensure that the second internal clock pulse is safely timed with respect to the first internal clock pulse, such that the first and second memory accesses do not conflict, has been to arrange the global control circuitry 28 to receive reset signals from each of the four banks and to combine these in a logical OR, and then generate the second internal clock pulse based on the output of that OR operation, i.e. only generating the second internal clock pulse once all banks indicate that they are ready. Whilst this is logically correct, the present techniques recognize that this approach can be rather slow because of the wire length associated with its implementation, in particular in the worst case scenario in which the first memory access is performed in the top bank 12 and the second memory access is also required to be performed in the top bank 12. As a consequence the reset signal from bank 12 must traverse the full length of the banks, to be combined in the logical OR with the resets from the other banks at the global control circuitry 28, which then generates the second internal clock pulse and this is sent back to the top bank 12. When many banks are provided, the use of a multiple input logical OR gate in order to combine the reset signals from each bank also add to the delay. This thus represents a critical delay path with regard to the initiation of the second memory access.

One embodiment of the present techniques addresses the improvement of this critical delay path by configuring the global control circuitry 28 and local bank control circuitry 24 in each bank as is schematically illustrated in FIG. 2. The present techniques improve on this critical delay path by providing comparator logic 30 in the global control circuitry 28 which is configured to combine the global clock signal CLK with signals relating to the first and second memory accesses to be performed. These signals comprise an internal clock enable signal for each of the first and second internal clock signals and an address for each of the first and second memory accesses. In particular, the comparator logic 30 is configured to receive an indication of which bank of the four each memory access is directed to. The essential function of the comparator logic 30 is to compare the bank of memory address A with the bank of memory address B and to generate a global second pulse generator signal in dependence on the result of that comparison. Assuming that both first and second internal clocks are enabled, the comparator logic 30 is configured to generate the global second pulse generator signal with a steady low (zero) state if the banks of the first and second memory addresses are the same. Conversely, if the banks of the first and second memory addresses are different, then the comparator logic 30 is configured to generate the global second pulse generator signal, specifically a rising edge of this signal, in response to a rising edge of the external clock signal CLK. This global second pulse generator signal is then distributed to the local control circuitry of the four banks. In each local bank control circuitry 24, local second pulse generation circuitry 32 is provided which receives this signal. The local second pulse generation circuitry 32 also receives an input from the local control circuitry 24 itself, namely the local reset signal indicating that this bank is ready to perform a next access. This local reset signal in this embodiment is provided by the local GTP signal (internal clock) and in particular the falling edge thereof. Local second pulse generation circuitry 32 is essentially configured as OR logic for the generation of the second pulse of the local internal clock (i.e. the second internal clock pulse). As such, if both access clocks are enabled and the bank address of the first memory access is the same as the bank address of the second memory access then the local second pulse generation circuitry 32 sees no change in the global second pulse generator signal and it is the toggling of the local reset which initiates the second internal clock pulse generated locally within the relevant bank Conversely, if both clocks are enabled and the bank address for the first memory access is different to the bank address for the second memory access, then it will be the toggling of the global second pulse generator signal which initiates the second internal clock pulse, since the reset signal for this bank will already be held in its reset state since the first memory access is not carried out in this bank.

Turning to the situation where one internal clock enable signals indicates that that internal clock is not enabled, in the situation that clock A is disabled (i.e. the first memory access in the double pumped pair is not carried out) but clock B is enabled (indicating that only the second memory access of the double pumped pair should be carried out), then since the comparison performed by the comparator logic 30 in the global control circuitry 28 takes the internal clock enable signals as inputs to that comparison, the result of that comparison will effectively indicate that the bank indicated by the first access and the second bank indicated by the second access do not match. As a result, the global second pulse generator signal will again be triggered by a rising edge of the external clock signal CLK (after a predetermined delay). Moreover, in the local bank control circuitry 24 (indicated by bank address B) the local reset signal 34 will not toggle (since the first memory access did not occur at all) and the second internal clock pulse is initiated by the rising edge of the global second pulse generator signal received from the global control circuitry 28. Conversely, if clock B is disabled (i.e. if the internal clock enable signals received by the global control circuitry 28 indicate that the second memory access of the double pumped access should not occur, then no second internal clock pulse is generated in any of the local bank control circuitry instances 24. For this purpose the clock B enable signal is also received by the local second pulse generation circuitry 32 in each local control circuitry 24, which can only operate when this clock B enable signal is active.

Figure 3:
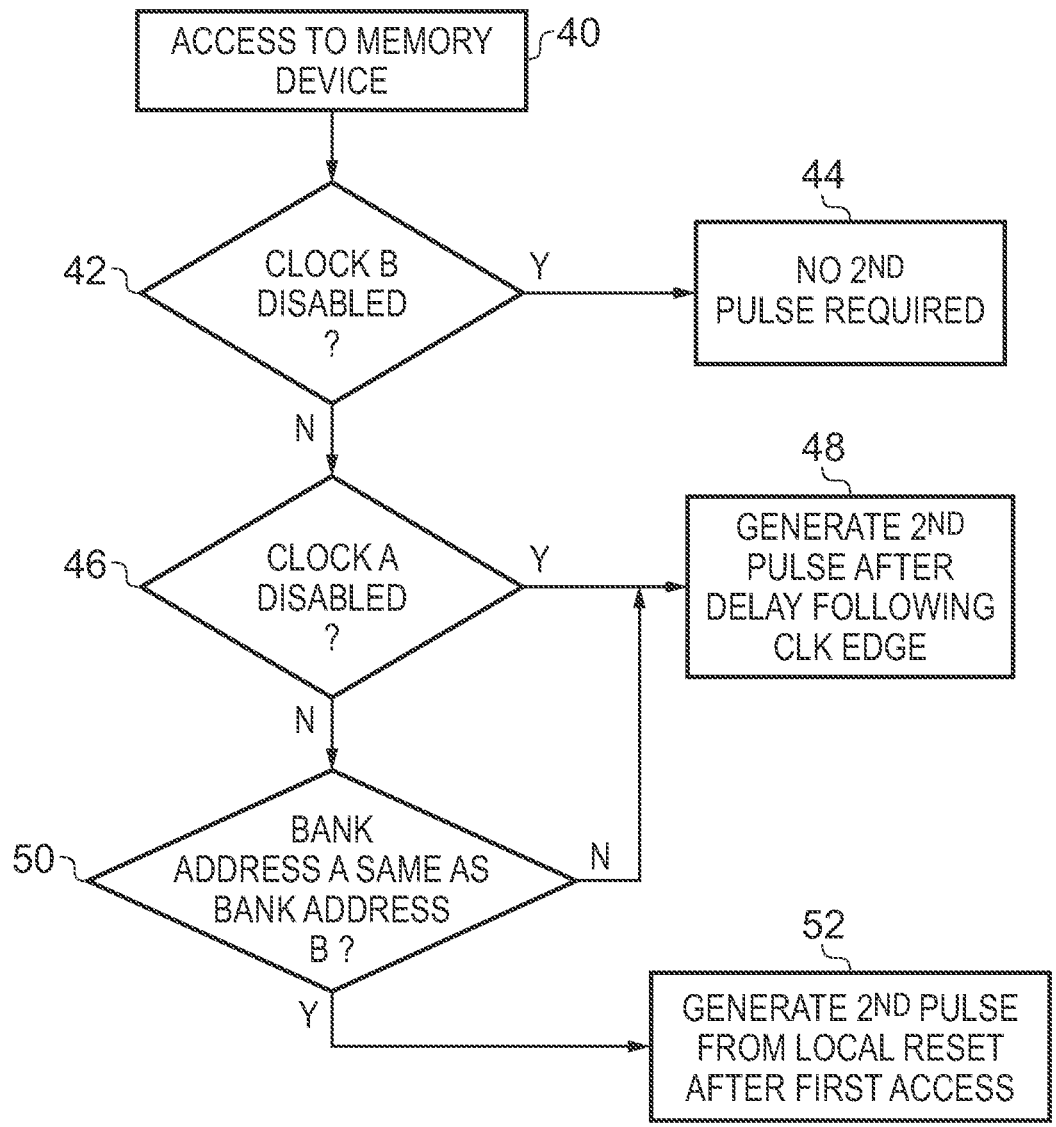
FIG. 3 shows a sequence of steps which are taken when generating a second internal clock pulse in one embodiment.

An overview of the method carried out in one embodiment by the memory device 10 is shown in FIG. 3. The flow begins at step 40 where a new (double pumped) access to the memory device is to be carried out. Next, it is first determined at step 42 if clock B (for the second access of the double memory access) is disabled. If it is then the flow proceeds to step 44. No second pulse is required, and the method steps for this double pumped memory access conclude. If however clock B is enabled then the flow proceeds to step 46, where it is determined if clock A (i.e. for the first access of the double memory access) is disabled. If it is (i.e. if only clock B is enabled) then the flow proceeds to step 48 where the second internal clock pulse for the second access is generated in the relevant bank following a predetermined delay after the rising edge of the external clock signal CLK. If however, clock A is also enabled then the flow proceeds from step 46 to step 50, where it is determined if the bank indicated by the first memory access of the double memory access is the same as the second bank indicated by the second access of the double memory access. If this is not the case, i.e. if the first and second accesses are to be carried out in different banks, then the flow also proceeds to step 48 for the second internal clock pulse to be generated in the bank indicated for the second access at a predetermined delay after the external clock signal CLK. If however bank address A is the same as bank address B (the first and second accesses of the double memory access are to the same bank) then the flow proceeds to step 52 where the second internal clock pulse within that bank is initiated by the local reset after the first access within that bank.

Figure 4:
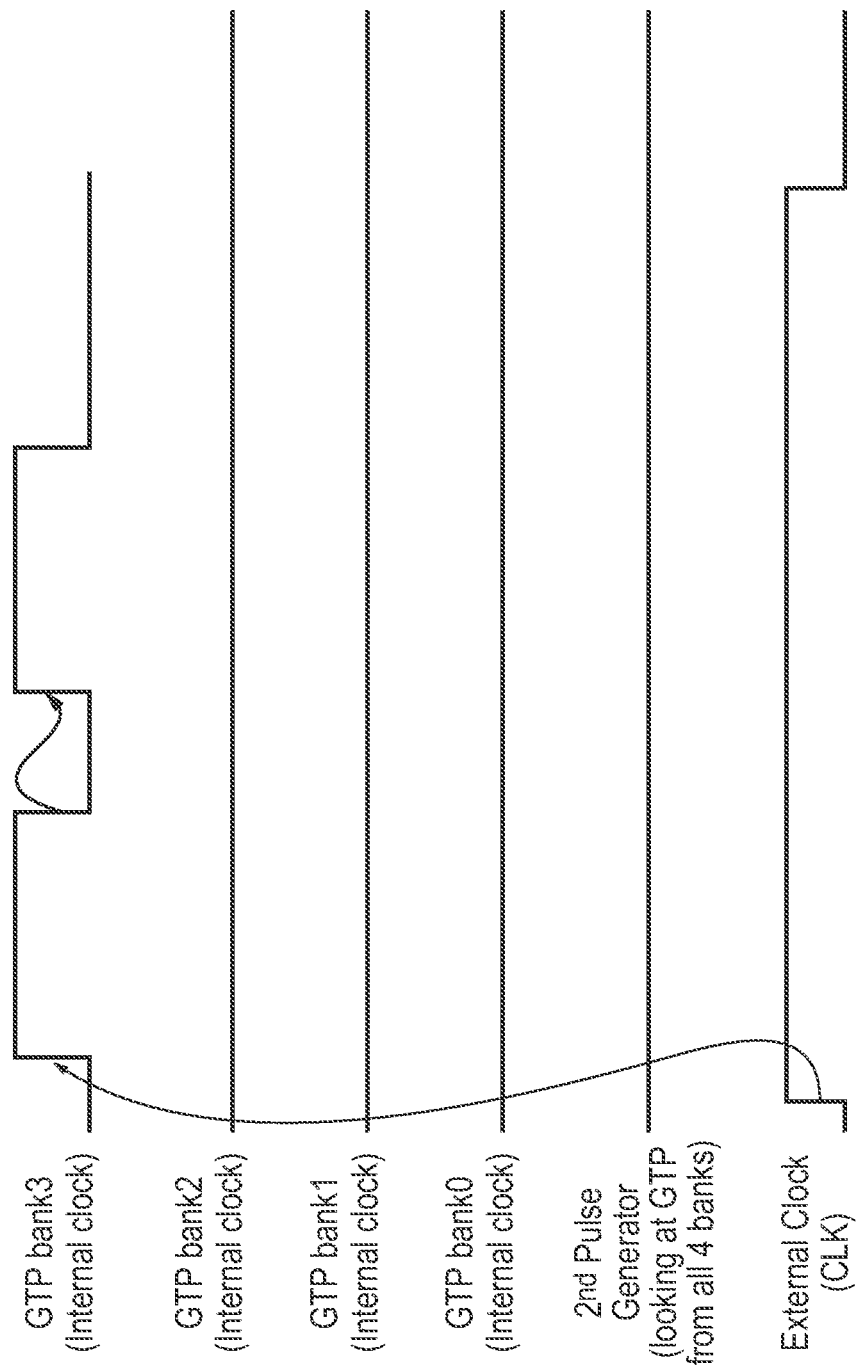
FIG. 4 shows the generation of the second internal clock pulse when both accesses of a double memory access the same bank in one embodiment.
Figure 5:
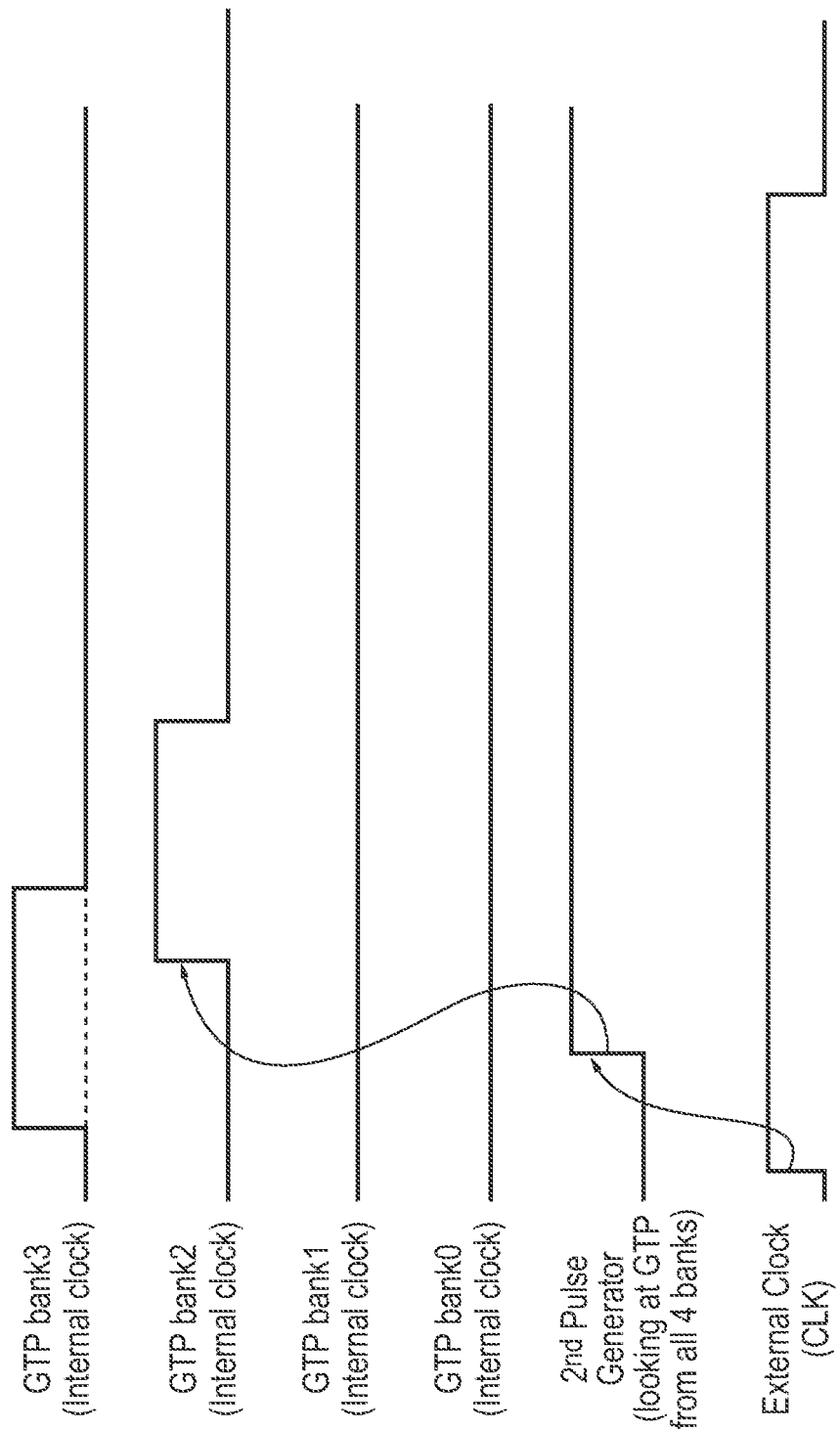
FIG. 5 shows the generation of the second internal clock pulse when the second access of a double memory access is to a different bank from the first access in one embodiment.

Example timings of various signals in the memory device of one embodiment are shown in FIGS. 4 and 5 relating to the timing of the generation of the second internal clock pulse. FIG. 4 illustrates a situation in which the first and second access of the double memory access are to the same bank, i.e. that bank address A is the same as bank address B. It can be seen that the start of the second internal clock pulse within the relevant bank (in this case the top most bank 3 (i.e. bank 12 in the illustration of FIG. 1)) is triggered by the conclusion of the first internal clock pulse within that bank. The first internal clock pulse in this bank is initiated by the rising edge of the external clock signal CLK. FIG. 5 illustrates a situation in which the second access of the double memory access is to a different bank from the first access of the double memory access (i.e. that bank address A does not match bank address B). In this situation, the second internal clock pulse in the bank indicated by the second access (in this example bank 2, i.e. corresponding to bank 14 in the illustration of FIG. 1) is initiated by the rising edge of the global second pulse generator signal produced by the comparator logic 30 of the global control circuitry 28. This signal itself is generated in response to the rising edge of the external clock (CLK). Note in particular that there is no dependence of the initiation of the second internal clock pulse on the first internal clock pulse, and indeed the first and second internal clock pulses overlap in that the second begins before the first has ended. This is possible because it has been recognized that these accesses are in two different banks and therefore these accesses cannot conflict within the banks being accessed. There may however be constraints on how much these first and second internal clock pulses can overlap due to the requirement for the data retrieved by these accesses in a read operation to be read out through the single read access port and for this reason the second internal clock pulse is initiated after a predetermined delay after the external clock signal in order not to violate this constraint. Note that the relative timings of the external clock signal CLK, the global second pulse generator signal and the second internal clock signal are the same if the first internal clock signal is disabled, since there is no dependency thereon. This is illustrated in FIG. 5 by the dashed line showing no internal clock signal for bank 3 (the top most bank).

Figure 6:
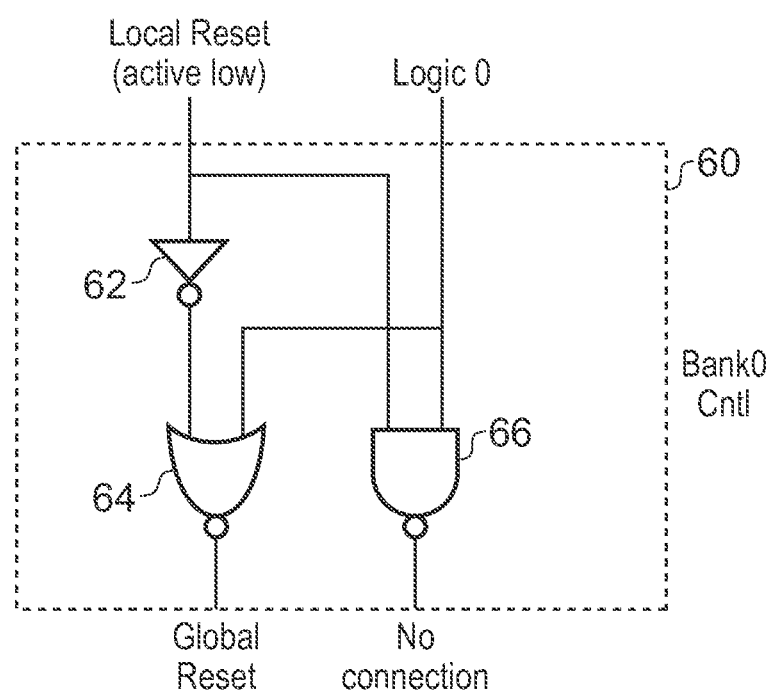
FIG. 6 schematically illustrates a combination logic circuitry block forming part of the global reset signal generation circuitry in one embodiment.

In operating a double pumped memory device there may be situations where global reset logic is required to monitor the local reset from every bank in the memory device and to combine these to generate a global reset signal for the memory device. The global reset signal can then be used to trigger the second clock pulse and a multiplexer selection for input A or input B. The global reset signal is thus a critical path for the cycle-time of the memory device. FIG. 6 schematically illustrates a combination logic circuitry block 60 which can be provided according to the present techniques in the local control circuitry of each bank present in the memory device in order to support this functionality.

The combination logic circuitry block 60 comprises an inverter 62, a NOR gate 64 and a NAND gate 66. In the example embodiment illustrated in FIG. 6, the combination logic circuitry block 60 is present in a single bank (Bank 0) which is the only bank in the memory device. The local reset generated in the local control circuitry of this bank provides one input to the combination logic circuitry block 60 and this signal is passed both to the inverter 62 and one input of the NAND gate 66. The other input to the combination logic circuitry block 60 is tied to a logical value of zero and is coupled to the other input of the NAND gate 66 and the other input of the NOR gate 64. The output of the NOR gate 64 provides the global reset signal. It will be noted that inputs to the NAND gate 66 are connected, but its output has no connection. This is due to the fact (which will be appreciated with reference to FIGS. 7 and 8) that the components and internal connections of the combination logic circuitry block are the same is various difference implementations, in particular in which varying numbers of banks are present in the memory device. This means that this block can be readily reused when generating the layout of the memory device, without the system designer having to be concerned with its internal configuration. It can therefore easily be scaled and programmed for many banked memory devices as well as the single bank configurations shown in FIG. 6.

Figure 7:
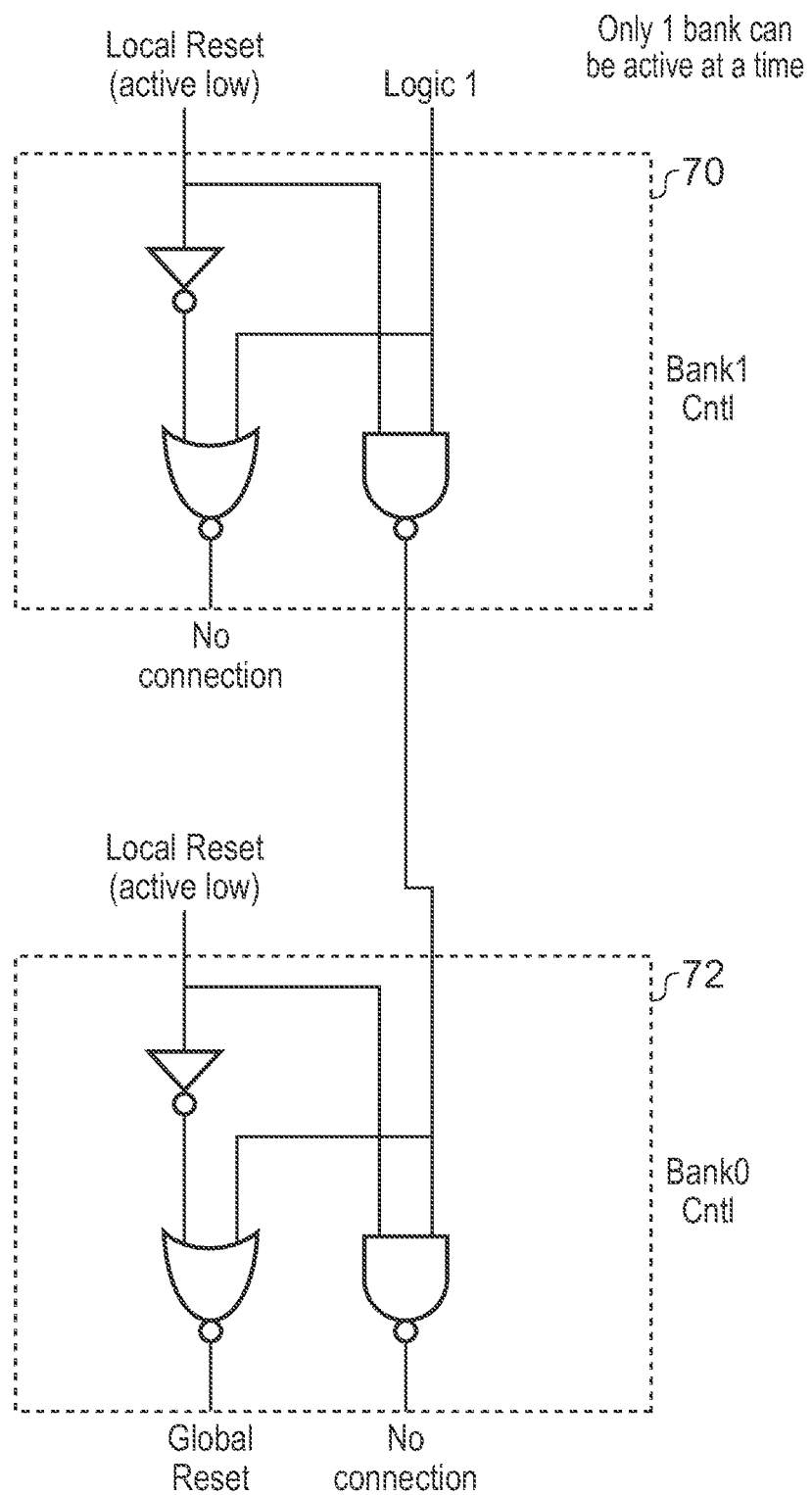
FIG. 7 schematically illustrates the concatenation of two combination logic circuitry blocks to generate a global reset signal in one embodiment.

FIG. 7 shows an example embodiment in a memory device having two banks. As illustrated, an instance of the combination logic circuitry block is present in each of the two banks, a first combination logic circuitry block 70 being provided in the local control circuitry of the first bank (Bank 1) of the concatenation and a second combination logic circuitry block 72 being provided in the local control circuitry of the second bank (Bank 0) of the concatenation. Both combination logic circuitry blocks 70 and 72 have the same internal configuration as described for combination logic circuitry block 60 in FIG. 6. However the inputs differ, in that whilst the local reset (left-hand) input remains the same the other (right-hand) input to the combination logic circuitry block 70 is tied to a logical value of 1. For combination logic circuitry block 72 this other (right-hand) input is connected to the output of the NAND gate of combination logic circuitry block 70. The outputs of the combination logic circuitry block 72 are the same as for combination logic circuitry block 60. The NOR gate output is not connected for combination logic circuitry block 70, whilst as just mentioned the output of the NAND gate of combination logic circuitry block 70 is connected to the right-hand input of the combination logic circuitry block 72. This latter connection thus provides the only path from one combination logic circuitry block to the next.

Figure 8:
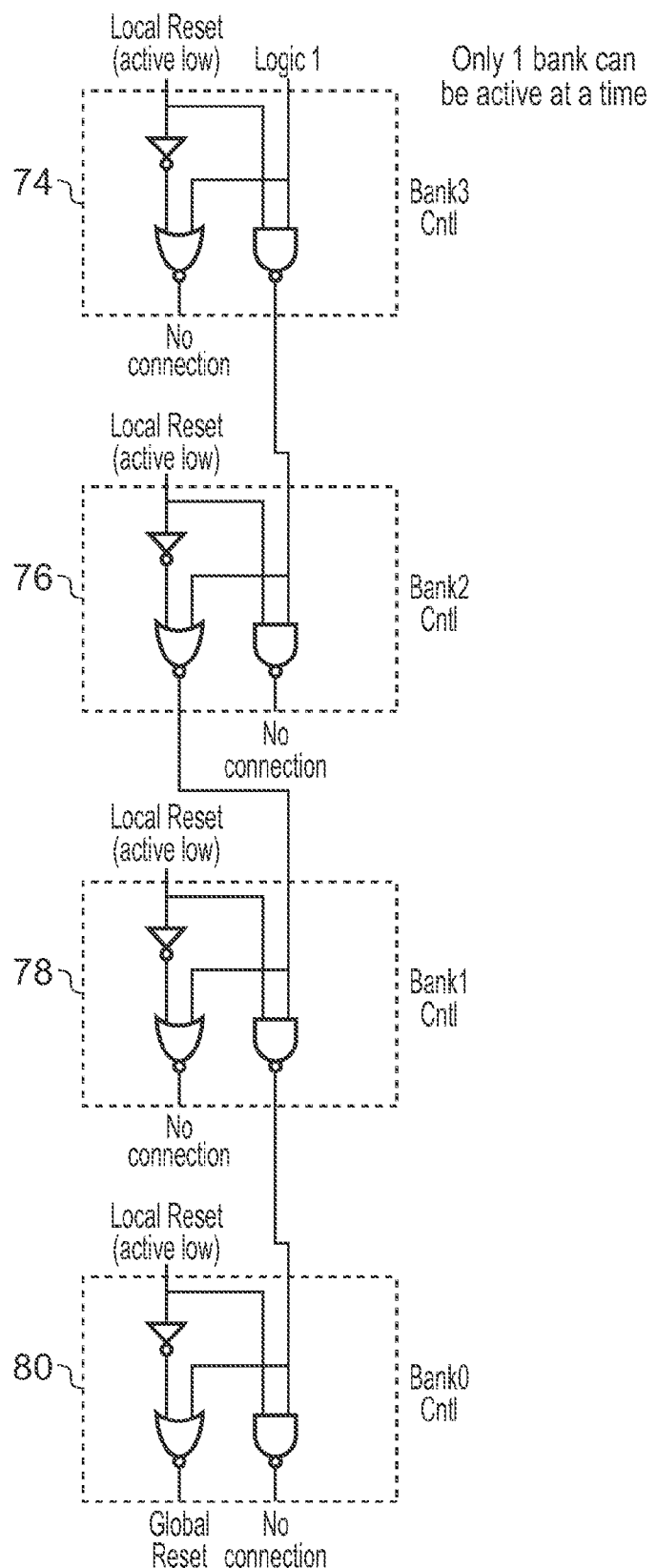
FIG. 8 schematically illustrates the concatenation of four combination logic circuitry blocks to generate the global reset signal in one embodiment.

FIG. 8 shows an example embodiment in a memory device having four banks. As illustrated, an instance of the combination logic circuitry block is present in each of the four banks:

a first combination logic circuitry block 74 being provided in the local control circuitry of the first bank (Bank 3) of the concatenation;

a second combination logic circuitry block 76 being provided in the local control circuitry of the second bank (Bank 2) of the concatenation;

a third combination logic circuitry block 78 being provided in the local control circuitry of the third bank (Bank 1) of the concatenation; and a fourth combination logic circuitry block 80 being provided in the local control circuitry of the fourth hank (Bank 0) of the concatenation. All four combination logic circuitry blocks 74, 76, 78 and 80 have the same internal configuration as described for combination logic circuitry block 60 in FIG. 6.

The inputs and outputs of the combination logic circuitry blocks shown in FIG. 8 essentially extend and repeat the configuration of the pair of combination logic circuitry blocks shown in FIG. 7, in that:

the left-hand input of each combination logic circuitry block is again coupled to the local reset signal;

the right-hand input of the first combination logic circuitry block in the concatenation (block 74) is again tied to a logical value of one;

the right-hand input of the second combination logic circuitry block in the concatenation (block 76) is again connected to the output of the NAND gate of the first combination logic circuitry block in the concatenation (block 74)—and similarly the right-hand input of the fourth combination logic circuitry block in the concatenation (block 80) is connected to the output of the NAND gate of the third combination logic circuitry block in the concatenation (block 78);

the global reset signal is again provided by the NOR gate output of the last combination logic circuitry block in the concatenation (block 80); and the alternating pattern of non-connected outputs is extended to two iterations. For this four bank configuration the right-hand input of the third combination logic circuitry block in the concatenation (block 78) is connected to the output NOR gate of the second combination logic circuitry block in the concatenation (block 76).

The configuration shown in FIG. 8 highlights that: for each bank only one additional stage of delay is introduced; only a single global metal line traversing the tour banks is used; and a metal line capacitance is limited to the connection provided from one bank to the next. The final global reset signal can therefore be generated with little delay and using only a single global line. As the examples shown with reference to FIGS. 6, 7 and 8 demonstrate the present technique is readily scalable regardless of the number of banks memory device. The low delay associated with the present technique improves on prior art techniques such as buffering the local reset signal in each bank and passing each local reset signal to the global control circuitry of the memory device where they are all combined via, multiple input AND logic (for example provided by a NAND4 gate and inverter in a four bank example). Buffering the reset signal in each bank according to this prior art technique is required in order to drive a long wire across the whole memory instance. Moreover this technique is slower because of the long wire propagation delay and the use of a NAND4 gate. Indeed this prior art technique is still slower for memory instances with only one or two banks in the memory instance, since 4 gates of delay from the first bank or the second bank will still be present (two inverters being used in each bank to provide the buffering). Tri-state bus approaches are also known but have the risk of contention and the timing for the keeper is hard to control.

Figure 9:
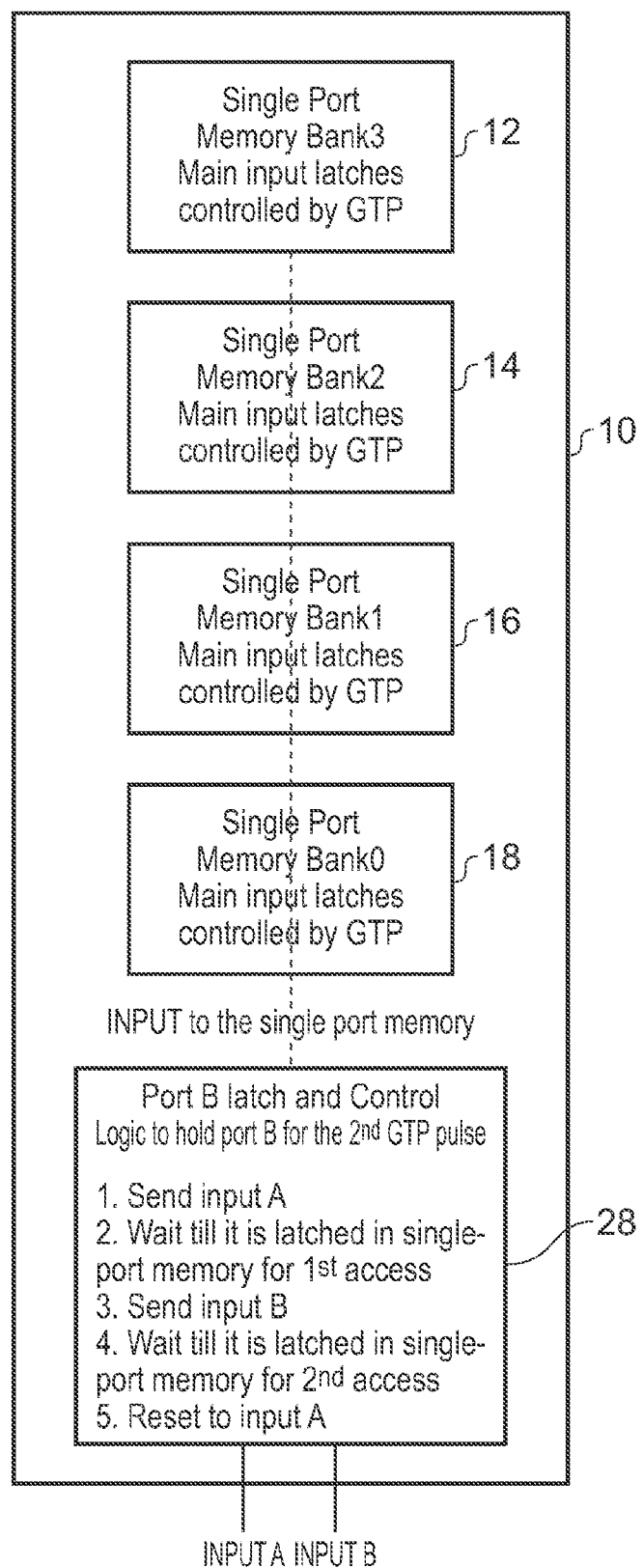
FIG. 9 schematically illustrates a memory device having four single port memory banks in one embodiment.

One issue faced by a memory device in which the bank or banks is/are single-ported and in which double pumping techniques are to be carried out is that two inputs (one for each memory access of the double pumped access—called access A and access B in the following) must be provided via the single port. Hence, input A must be latched at the single port input for the first pulse cycle and input B must be latched at the single port input for the second pulse cycle. This functionality and configuration is schematically illustrated in FIG. 9 showing an annotated version of the memory device 10 of FIG. 1. The present technique is particularly concerned with the latching of the inputs A and B described in the annotated global control circuitry box 28, as will become clearer with reference to the following figures.

Figure 10A:
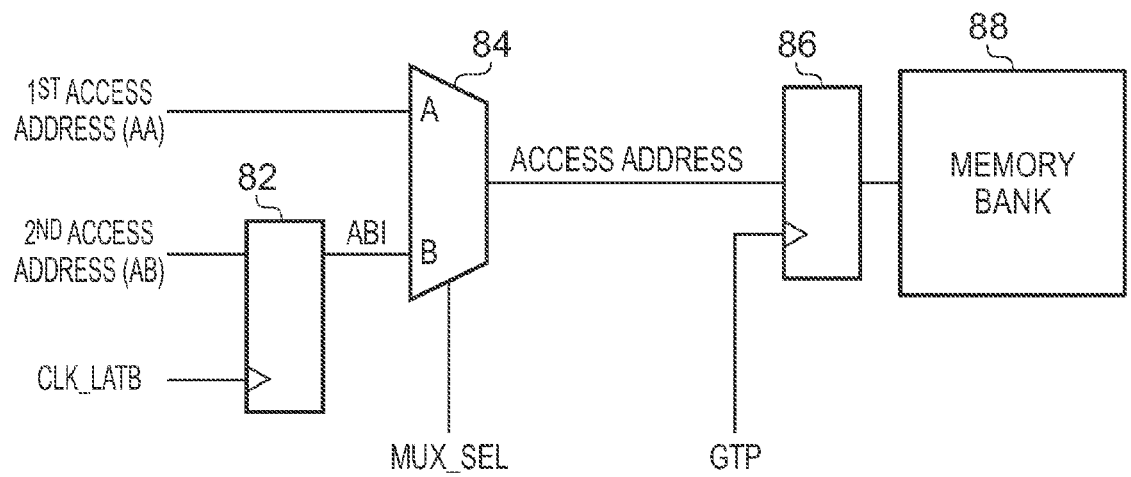
FIG. 10A schematically illustrates a portion of the global control circuitry of the memory device in one embodiment.

FIG. 10A schematically illustrates components of the global control circuitry 28 which support this functionality. These comprise a single latch 82, a multiplexer 84 and output latch 86. Input A (which in this embodiment is a memory address AA for the first access A, but could equally be a data value) provides one input to the multiplexer 84, whilst the output of single latch 82 provides the other input (ABI). Single latch 82 receives input B (which in this embodiment is a memory address AB for the second access B, but where input A could be a data value, input B would then also be a data value) at its data input, to then provide the output ABI, in dependence on the latch clock signal CLK_LATB. The access address output by the multiplexer 84 is received by the output latch 86 and output to the single ported memory bank 88 in dependence on the internal clock signal GTP.

Hence rather than using a full flip-flop to hold input B steady for the full clock cycle, only a single latch is used. Note that latch 82 is clocked by the latch clock signal CLK_LATB and not by CLK. The generation of this adapted latch clock CLK_LATB is described in more detail below. This use of a single latch reduces the area required to provide this selective input circuitry (one example embodiment achieves at least nine poly track of area saving for the memory instance for example), which is particularly beneficial in the context of a contemporary memory device with a large number of input pins.

Figure 10B:
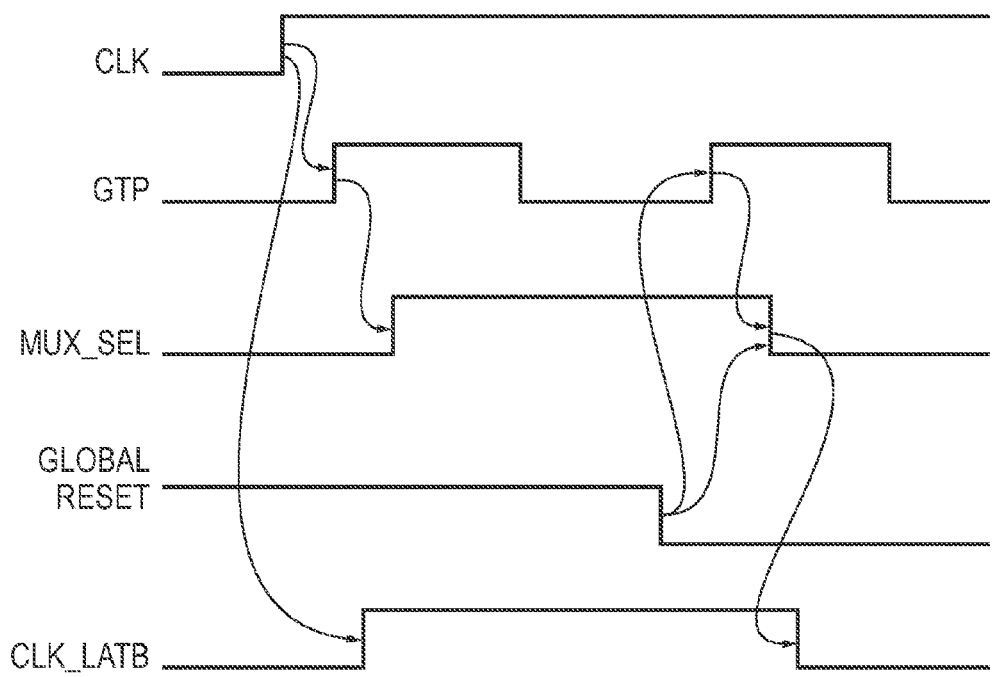
FIG. 10B shows example timings of various signals related to the circuitry shown FIG. 10A.

Example timings of signals relevant to the configurations shown in FIG. 10A are shown in FIG. 10B. The rising edge of the external clock signal CLK generates the rising edge of the first pulse of the internal clock signal GTP. This in turn causes the multiplexer selection signal MUX_SET to toggle (from its default of selecting input A to selecting input B). By this point the first access address AA is already latched in the output latch 86. The rising edge of the external clock signal CLK also generates the rising edge of the latch clock CLK_LATB, in turn causing the second access address AB to be provided as a signal ABI at the input B of the multiplexer 84, Shortly thereafter the multiplexer selection signal MUX_SEL toggles and the access address AB is passed by the multiplexer 84 to the input of the output latch 86. When the global reset signal toggles, indicating that the second access can be initiated, this generates the rising edge of the second pulse of the internal clock signal GTP, allowing the second access address AB to be latched in the output latch 86. Shortly thereafter this causes the multiplexer selection signal MUX_SEL to toggle again returning to its default selection of selecting input A. In turn, this toggling of the multiplexer selection signal MUX_SEL causes the generation of the falling edge of the latch clock CLK_LATB.

Figure 11:
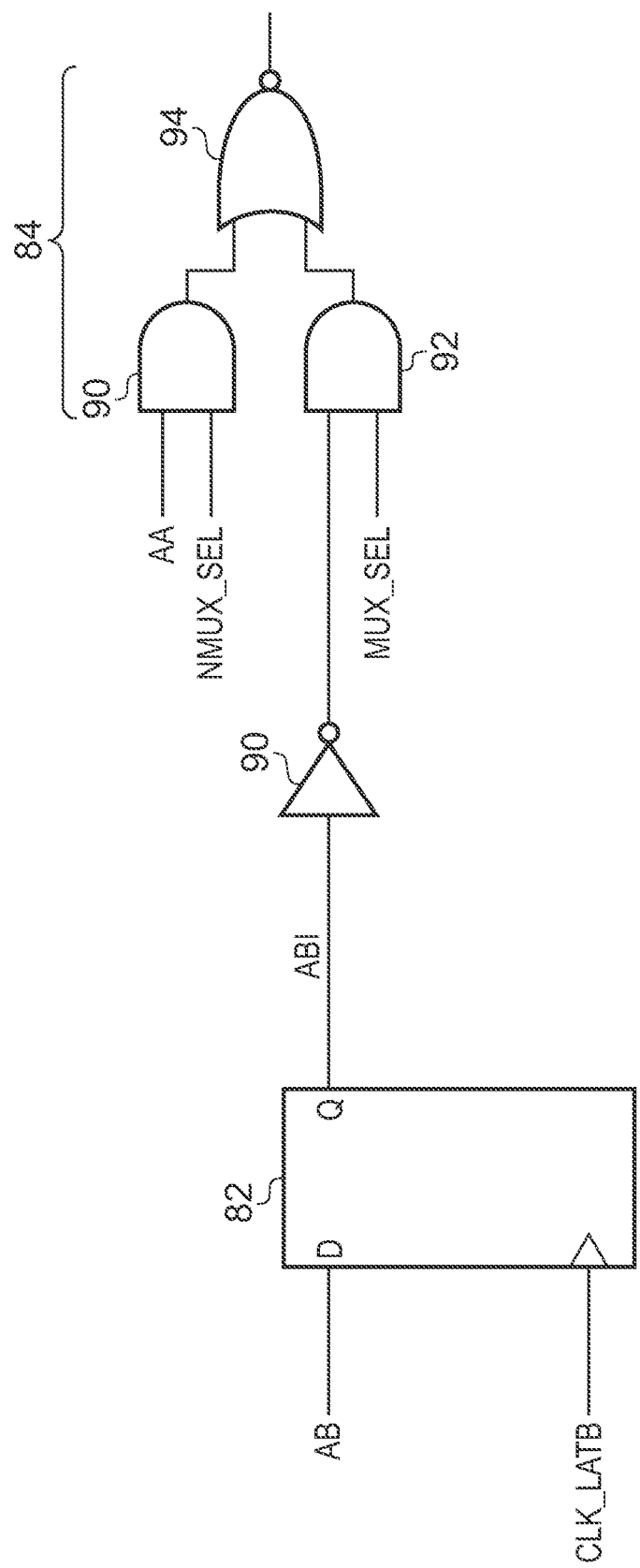
FIG. 11 schematically illustrates an example configuration of the circuitry shown in FIG. 10A.

FIG. 11 schematically illustrates one example embodiment of the latch 82 and the multiplexer 84. The output Q of the latch 82 is in fact inverted with respect to its input D and hence an inverter 90 is provided on the path from Q to the multiplexer 84 to re-invert this value, The multiplexer 84 itself comprises two NAND gates 90, 92 and a NOR gate 94. The first access address AA and NMUX_SEL (the complement of the multiplexer selection signal) provide the inputs to NAND gate 90 whilst the output of inverter 90 and the multiplexer selection signal MUX_SEL provide the inputs to NAND gate 92. The respective outputs of NAND gates 90, 92 provide the inputs for NOR gate 94.

Figure 12:
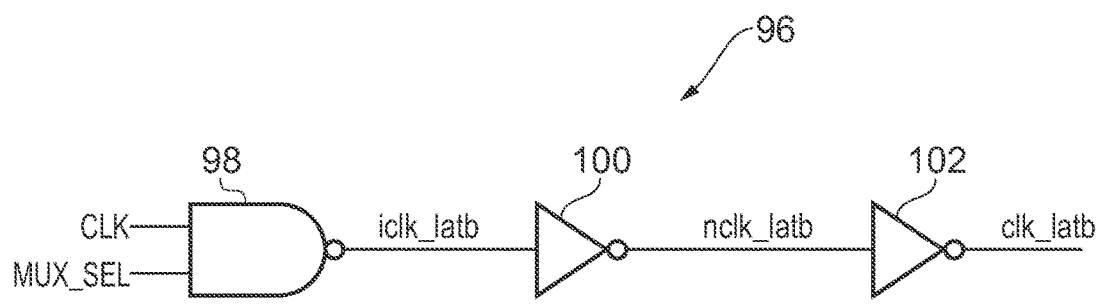
FIG. 12 schematically illustrates the generation of a latch control signal interlocked by a multiplexer selection signal in one embodiment.

FIG. 12 schematically illustrates one example embodiment of latch clock generation circuitry 96 which generates the latch clock CLK_LATB. The latch clock generation circuitry 96 comprises NAND gate 98, inverter 100 and inverter 102. The two inputs to the NAND gate 98 are the external clock signal CLK and the multiplexer selection signal MUX_SEL. Hence, this configuration of the latch clock generation circuitry 96 means that the rising edge of the latch clock CLK_LATB quickly follows after the rising edge of external clock signal CLK and the falling edge of the latch clock CLK_LATB is interlocked by the multiplexer selection signal MUX_SEL which itself is constrained to follow the rising edge of the second internal clock pulse.

Figure 13:
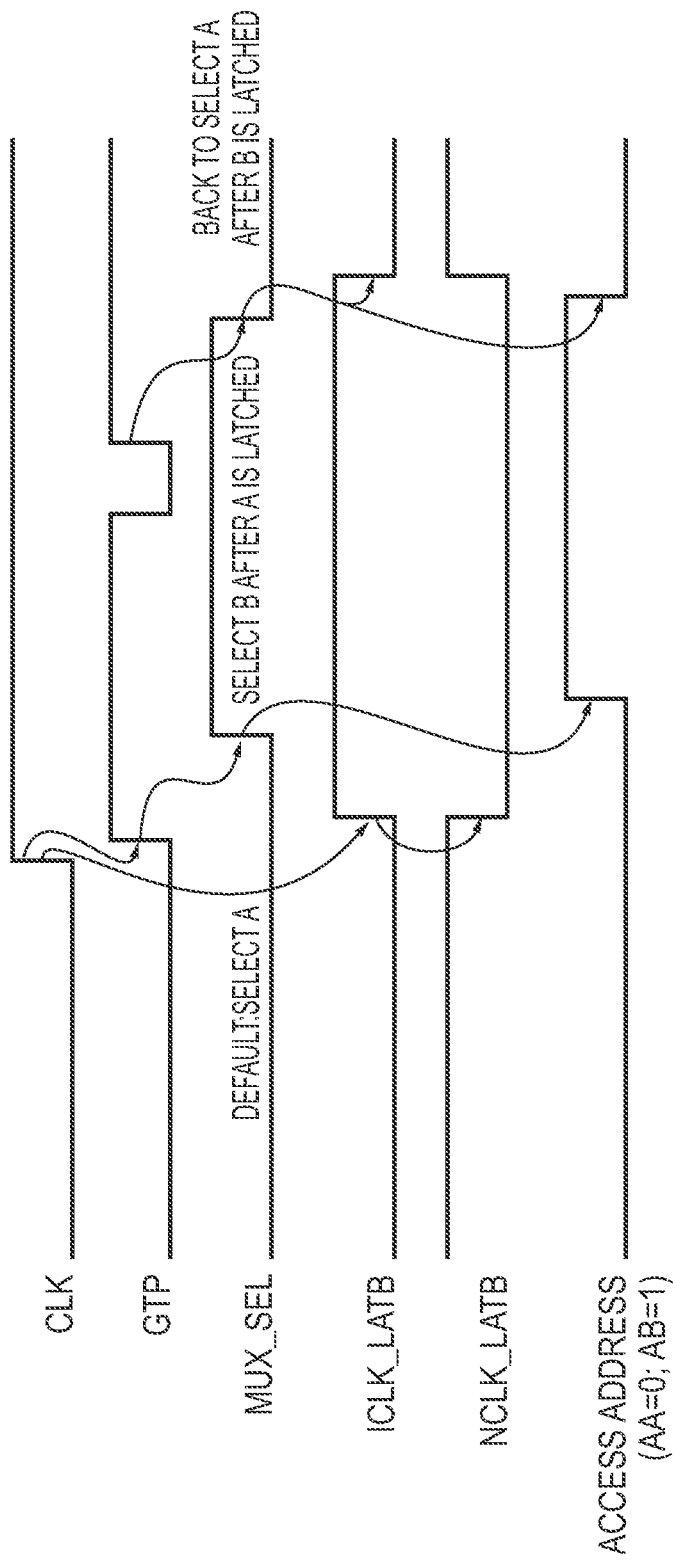
FIG. 13 shows an example timings of various signals related to the circuitry shown in FIGS. 10A, 11 and 12.

Example timings of signals relevant to the latch clock generation circuitry configuration shown in FIG. 12, in the context of the global control circuitry components shown in FIG. 10A, are shown in FIG. 13. As before the rising edge of the external clock signal CLK generates the rising edge of the first pulse of the internal clock signal GTP, which in turn causes the multiplexer selection signal MUX_SEL to toggle (from its default of selecting input A to selecting input B). The rising edge of CLK also generates a rising edge of the internal latch clock signal ICLK_LATB and consequently a falling edge of the complement internal latch clock signal NCLK_LATB.

The rising edge of the multiplexer selection signal MUX_SEL causes the access address provided by the multiplexer 84 to the input of the output latch 86 to switch from AA to AB. The rising edge of the second pulse of the internal clock signal GTP causes the multiplexer selection signal MUX_SEL to revert to its default selection of selecting input A and in turn this falling edge of MUX_SEL causes a falling edge of the internal latch clock signal ICLK_LATB (and consequently a rising edge of the complement internal latch clock signal NCLK_LATB). This falling edge of MUX_SEL also causes the access address provided to the output latch 86 to return to its first configuration (which will again be the first access address AA unless this has already changed in the interim in set up for a subsequent access).

Figure 14:
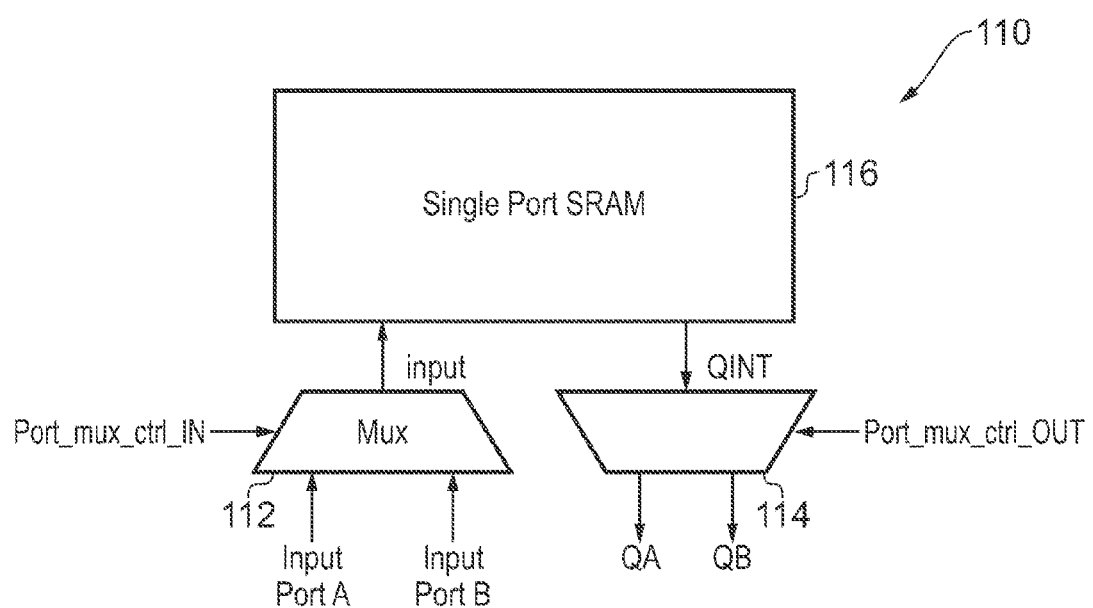
FIG. 14 schematically illustrates the adaptation of a single ported SRAM memory device to have dual inputs and dual outputs in one embodiment.

FIG. 14 schematically illustrates a pseudo dual port SRAM device 110, in which peripheral multiplexing circuitry 112 and 114 is provided to enable a single port SRAM 116 to be accessed as though it has dual input and output ports. Input multiplexing circuitry 112 selects between input port A and input port B in dependence on the multiplexer selection signal PORT_MUX CTRL_IN, whilst output multiplexing circuitry 114 provides the internal data output QINT to one of the data outputs QA and QB in dependence on the multiplexer selection signal PORT_MUX_CTRL_OUT.

Figure 15:
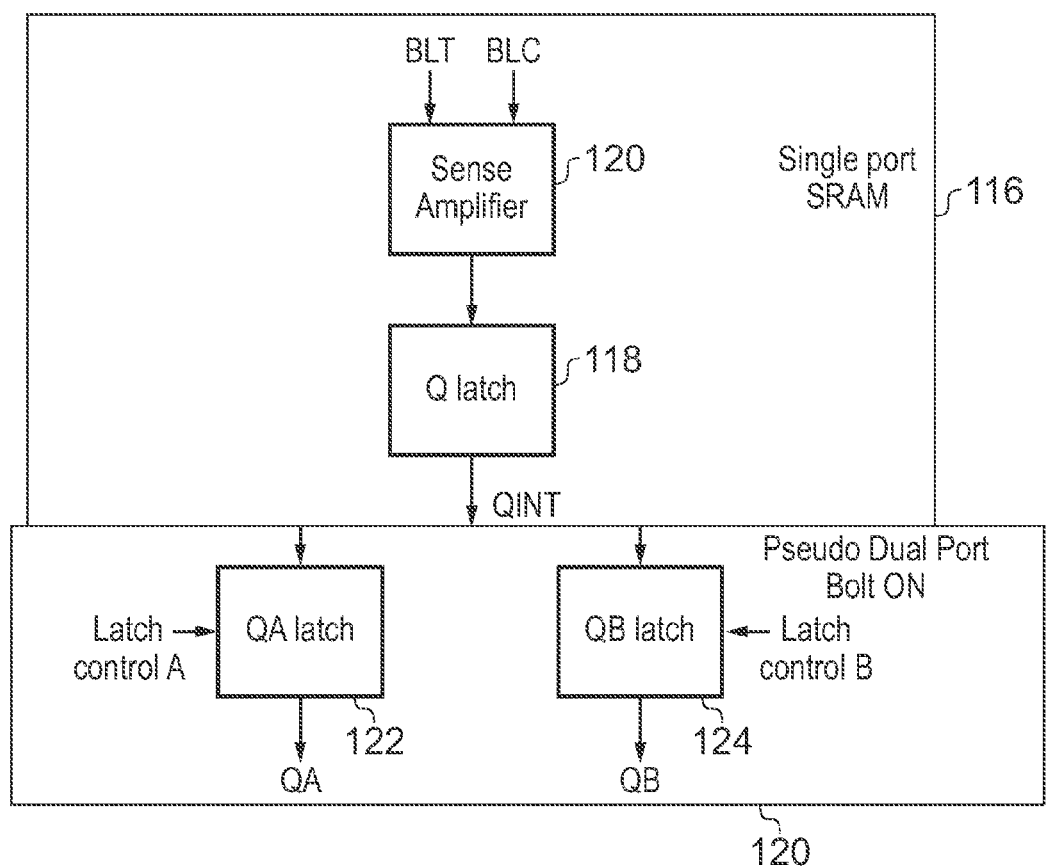
FIG. 15 schematically illustrates the provision of two supplementary data output latches in one embodiment.

More detail of the output path from the single port SRAM 116 is shown in FIG. 15, The single port SRAM 116 has a Q latch 118 at the output of the sense amplifier 120 (which itself generates the internal data output value QINT in dependence on a voltage measurement made with respect to the pair of bit lines BLT and BLC). Peripheral circuitry 120 provides port-specific Q latches 122 and 124. These Q latches 122 and 124 are configured to be transparent only during the read operation on the corresponding port and opaque otherwise. The internal data output value QINT generated by the first memory access (of the double memory access initiated in response to a single edge of the external clock signal CLK) is latched in the QA latch 122 and the internal data output value QINT generated by the second memory access is latched in the QB latch 124.

Figure 16:
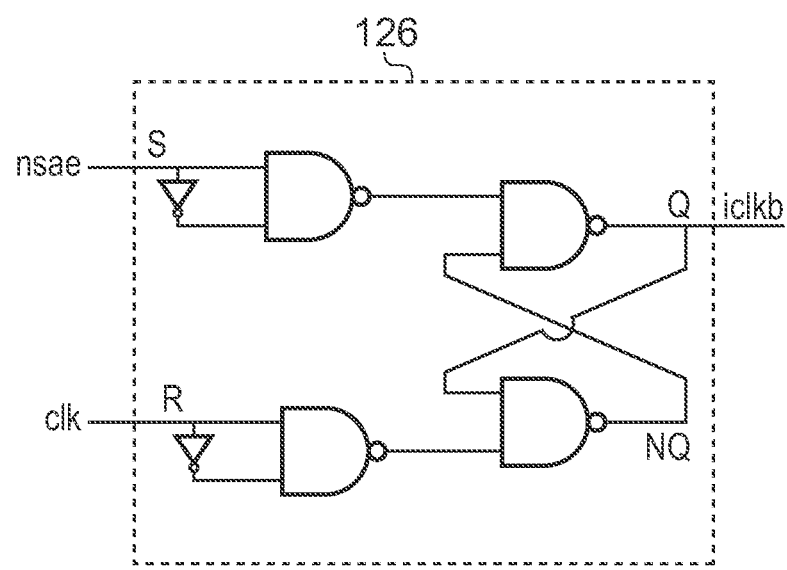
FIG. 16 schematically illustrates internal clock signal generation circuitry in one embodiment.
Figure 17:
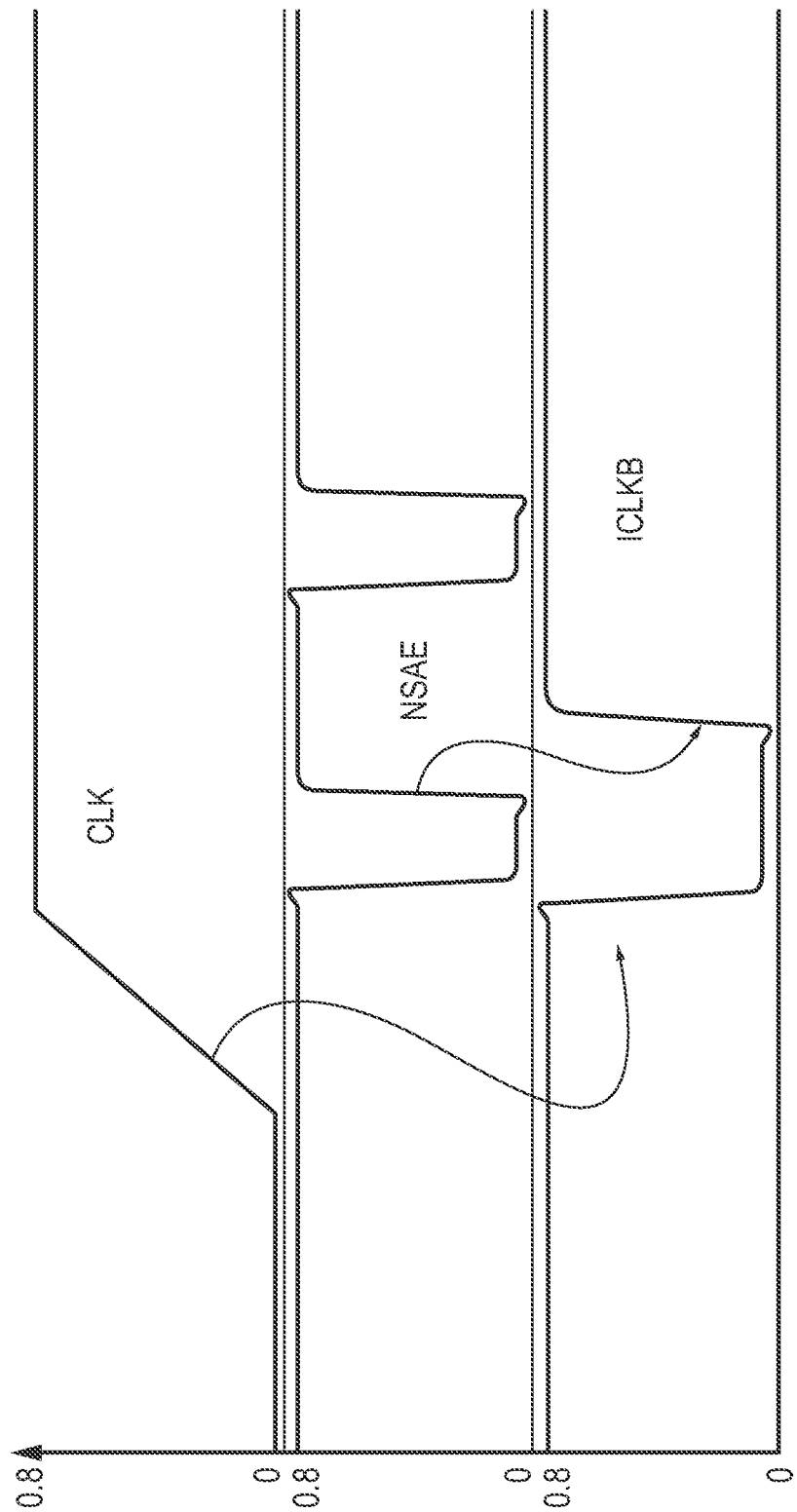
FIG. 17 shows example timings of signals related to the internal clock signal generation circuitry of FIG. 16.

A latch control signal for each port specific Q latch 122 and 124 is designed to open the respective latch only during the READ operation on the particular port or in DFT mode (as the port specific Q latches are also part of a scan chain implementation). To minimize the effect of the extra latch on the access time the latch control signal for the QA latch 122 is synchronized to open the latch with the rising edge of the external CLK signal (port A) and with the rising edge of an internal clock signal ICLKB signal for port B. Also each port specific Q latch 122 and 124 is closed with the successive falling edges of a sense amplifier enable signal SAE (or successive rising edges of NSAE—the complement of SAE), which signals the end of the sensing operation of sense amplifier 120. Internal clock signal generation circuitry 126 configured to generate the ICIKB signal from NSAE and CLK is schematically illustrated in FIG. 16. Example timings of the signals CLK, SAE and ICLKB are shown in FIG. 17.

A glossary of various signals relevant to the embodiment illustrated in FIGS. 15, 16, 18, 19 and 20 is set out below:

CLK—the external clock, CLK going from LOW to HIGH signals the start of the memory operation for port A.

ICLKB—the internal clock for port B. ICLKB going from LOW to HIGH initiates the memory operation for port B.

GWENA & GWENB—global write enable for port A and port B respectively. GWENA/GWENB=0 signals a write operation on port A/port B respectively, while GWENA/GWENB=1 signals a read operation on port A/port B respectively.

CENA & CENB—chip enable for port A & B, CENA/CENB=0 enables memory operation on port A/port B respectively. CENA/CENB=1 disables memory operation on portA/portB respectively.

DFTRAMBYP—control signal for the memory to go into test mode (when DFTRAMBYP=1).

NSAE—inverted sense amplifier enable pulse (NSAE=!SAE). NSAE=1→0 (SAE=0→1) enables the sense amplifier, while NSAE=0→1 (SAE=1→0) disables the sense amplifier and signals the end of the READ operation.

PCLK_A—port latch clock for port A. PCLK_A=0→1 makes the QA latch transparent (QINT=QA), while PCLK_B=1→0 makes the QA latch opaque.

PCLK_B—port latch clock for port B. PCLK_B=0→1 makes the QB latch transparent (QINT=QB), while PCLK_B=1→0 makes the QB latch opaque.

ICLKB signal is HIGH in the quiescent state. If CENB=0, ICLKB is set LOW by the external CLK going HIGH, while ICLKB is set HIGH by NSAE signal going HIGH (which signals the end of the READ operation on port A).

Figure 18:
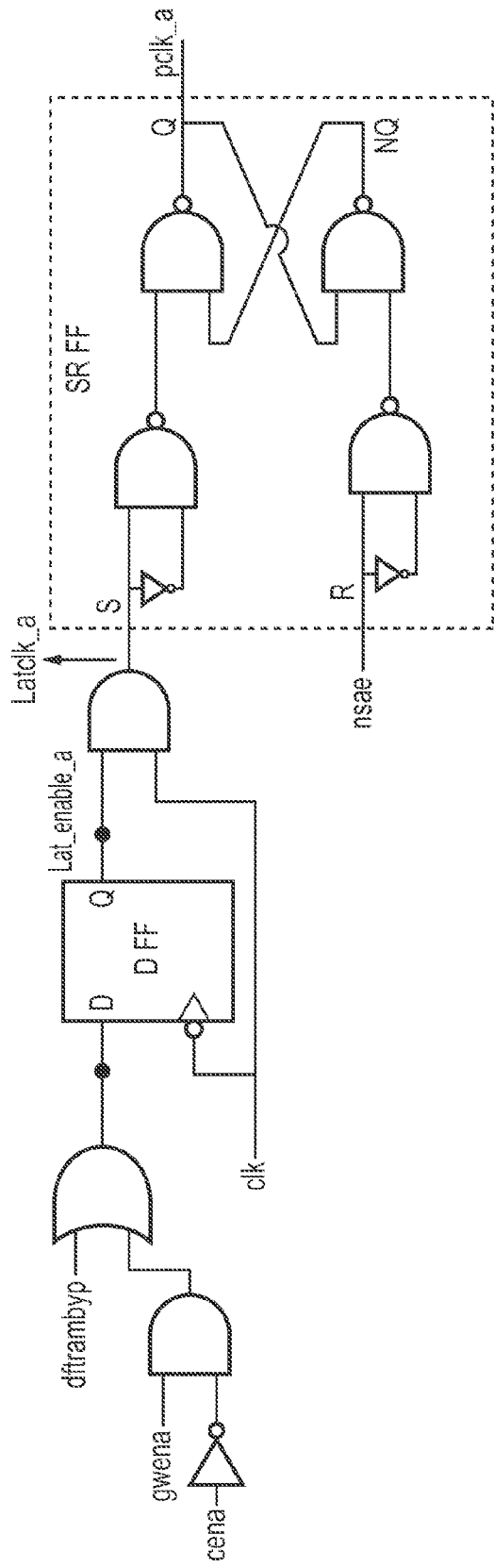
FIG. 18 schematically illustrates first supplementary data latch control circuitry in one embodiment.
Figure 19:
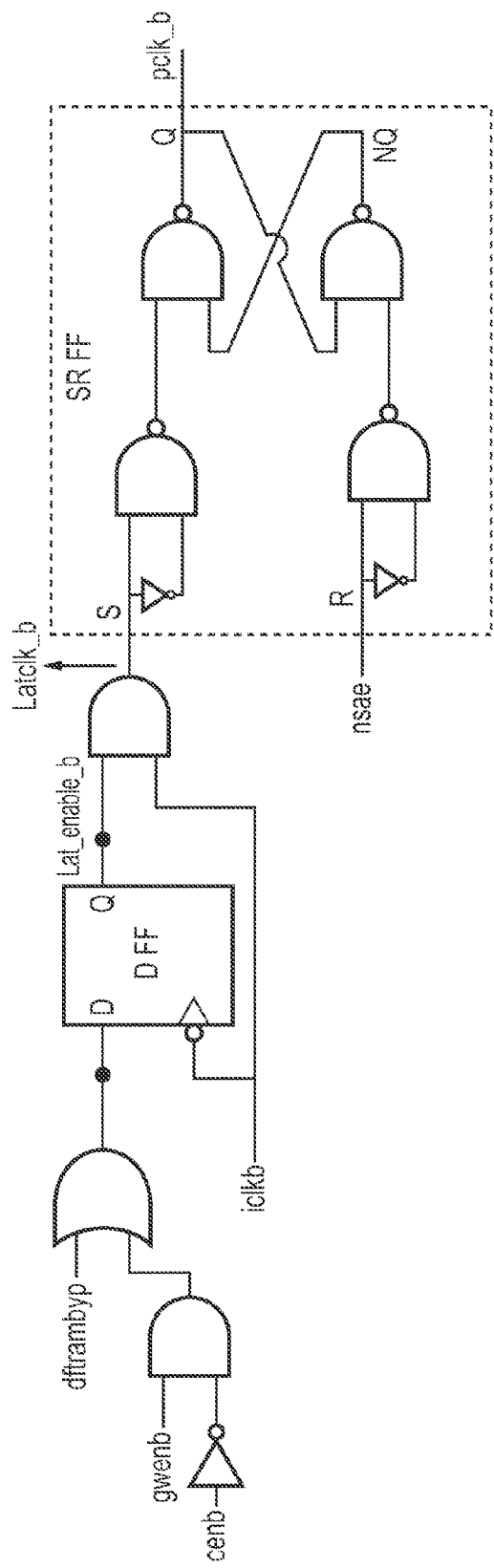
FIG. 19 schematically illustrates second supplementary data latch control circuitry in one embodiment.
Figure 20:
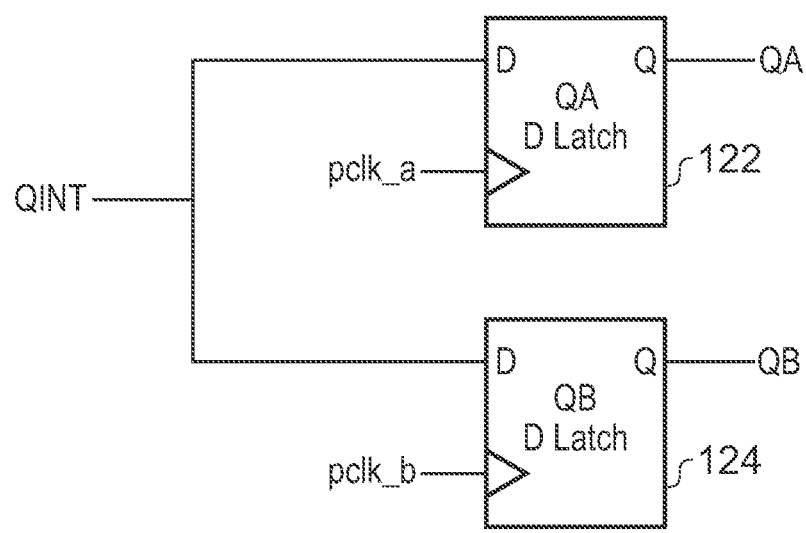
FIG. 20 schematically illustrates first and second supplementary data output latches in one embodiment.

FIG. 18 schematically illustrates the generation of the port latch clock PCLK_A for port A and FIG. 19 schematically illustrates the generation of the port latch clock PCLK_B for port B. The latch enable logic can be defined as !CENA*GWENA+DFTRAMBYP for port A & !CENB*GWENB+DFTRAMBYP for port B. The use of port latch clock PCLK_A to control port A (specifically, QA latch 122) and the use of port latch clock PCLK_B to control port B (specifically, QB latch 124) is schematically illustrated in FIG. 20. Note that the embodiments shown in FIGS. 14, 15 and 20 may also be adapted for a multi-bank configuration, in which case a channel select signal is then an additional input to the latch control signal generation circuitry and each bank will have its own set of port specific Q latches.

Figure 21:
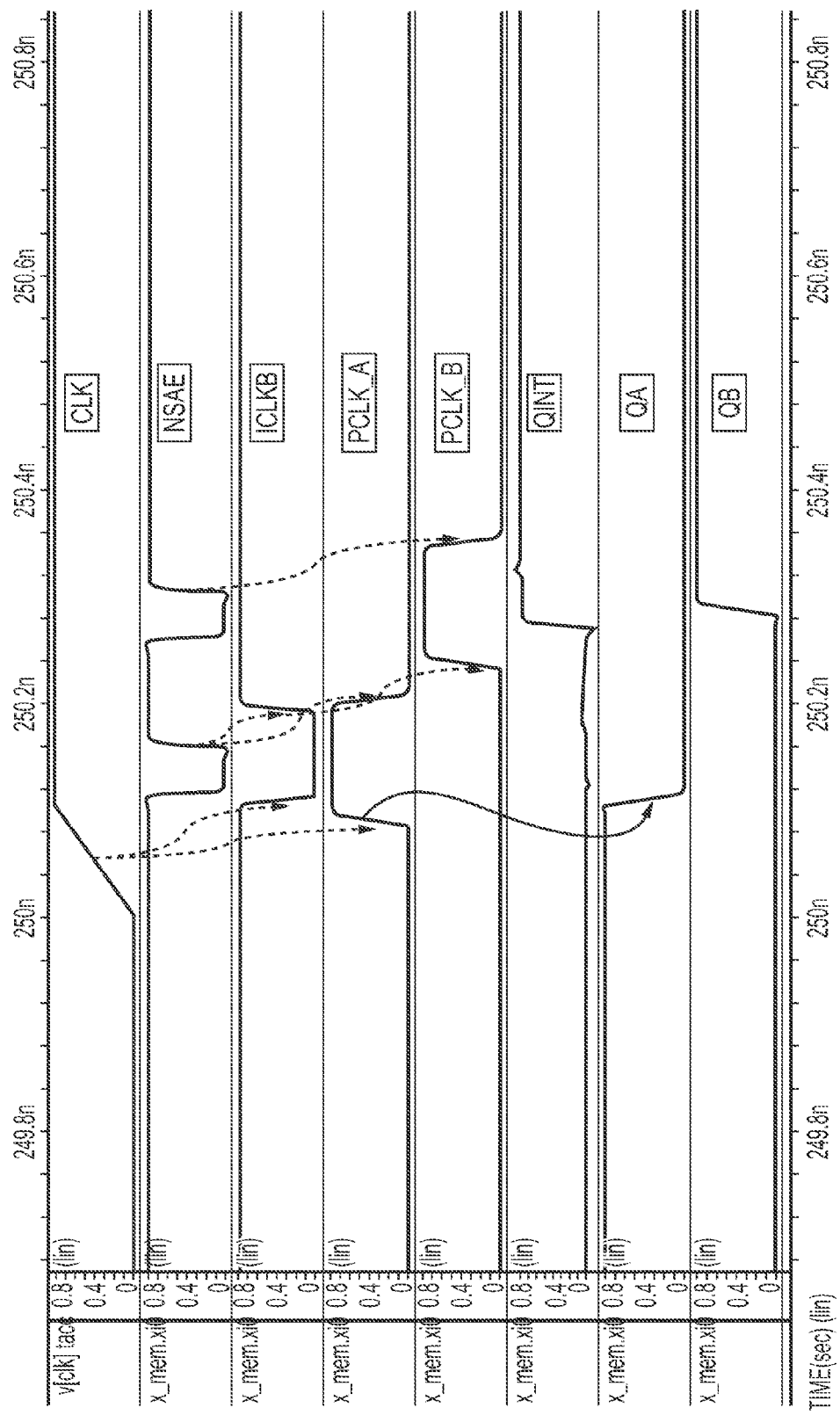
FIG. 21 shows example timings of signals related to the embodiments shown in FIGS. 16, 18, 19 and 20.

FIG. 21 shows example timings of the port latch clock signal PCLK_A for port A and the port latch clock signal PCLK_B for port B and the consequent opening and closing of the QA and QB latches. The rising edge of CLK causes PCLK_A to go HIGH thereby opening the QA latch and capturing the state of QINT as QA. Thereafter, the first rising edge of NSAE (which signals the end of the READ operation on Port A) causes PCLK_A to go LOW, thereby making the QA latch opaque.

The rising edge of CLK also causes ICLKB to go LOW, whilst the first rising edge of NSAE (signalling the end of READ operation on Port A) causes ICLKB to go HIGH, which initiates the SRAM operation for Port B. The rising edge of ICLKB causes PCLK_B signal to go HIGH, thereby opening the QB latch and capturing the state of QINT as QB. Thereafter, the second rising edge of NSAE (which signals the end of READ operation on Port B) causes PCLK_B to go LOW thereby making the QB latch opaque.

Figure 22:
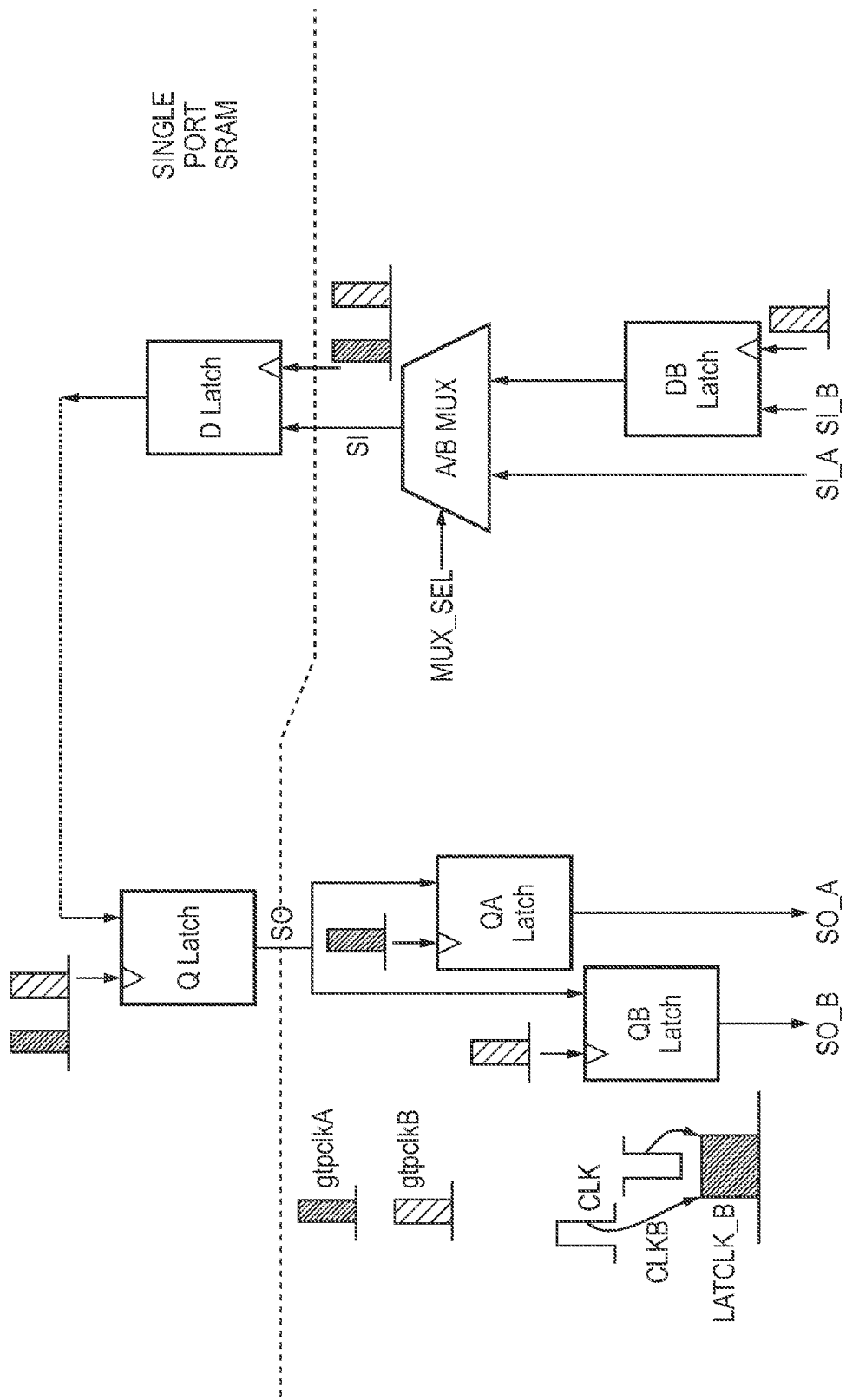
FIG. 22 schematically illustrates the implementation of a port-specific scan chain using an additional port-specific Q latch in one embodiment.

FIG. 22 schematically illustrates an embodiment in which the use of an additional port specific Q latch enables the implementation of port specific scan chain implementation for 2 ports in a double pulse multi-bank memory. As can be seen in the figure, this is accomplished using 5 latches and one 2-to-1 multiplexer. A glossary of the signals and labels used in FIG. 22 is as follows:

SI_A: Scan in pin for Port A;
SI_B: Scan in pin for Port B;
SI: Scan in pin for the primary data (D) latch;
SO: Scan out pin for the primary output (Q) latch;
SO_A: Scan out pin tor Port A;
SO_B: Scan out pin for Port B;
MUX_SEL: Multiplexer select signal to select either Port A or Port B input;
GTPCLK_A: Internal clock pulse for memory operation on Port A; and
GTPCLK_B: Internal clock pulse for memory operation on Port B.

Figure 23:
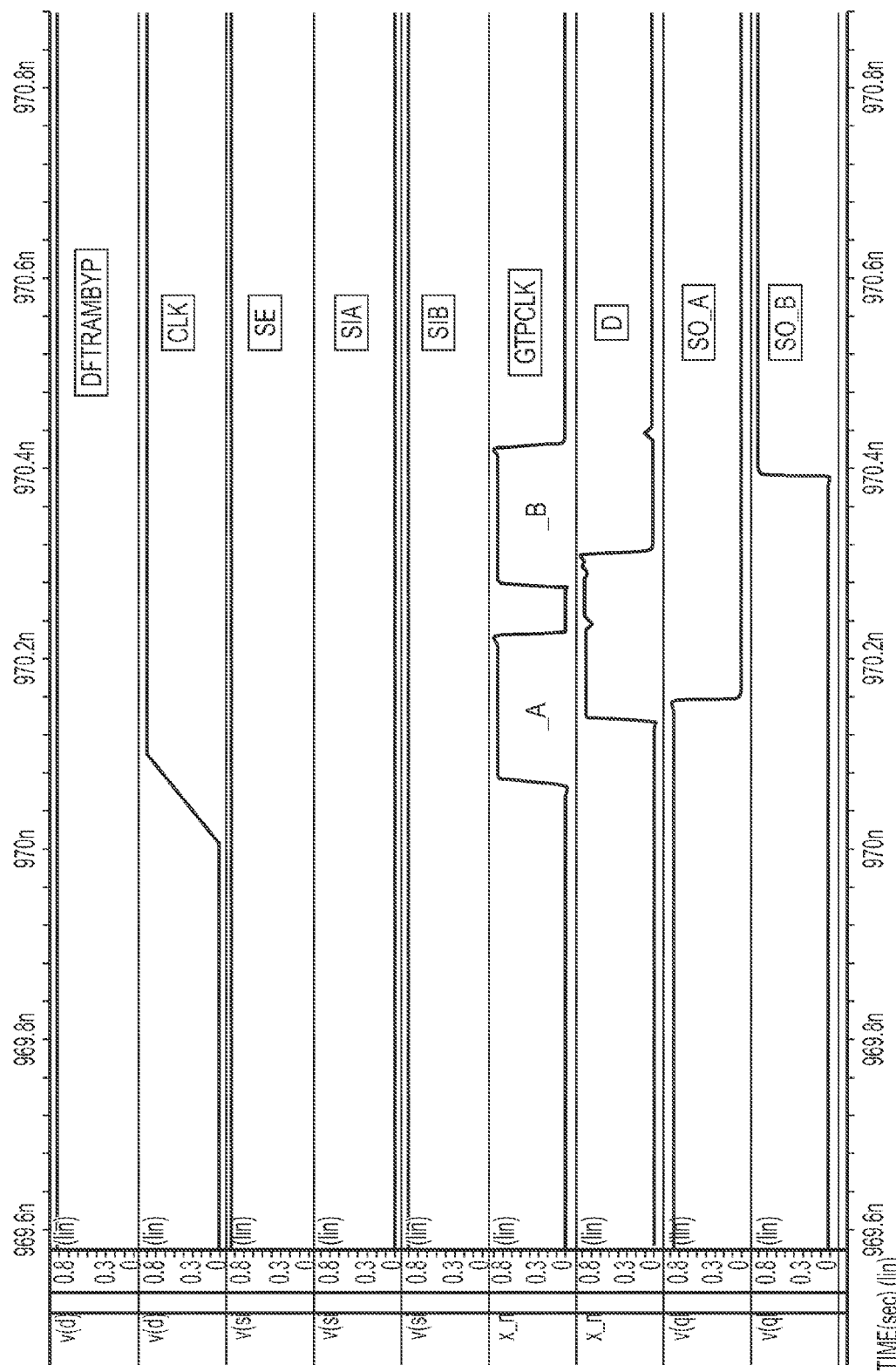
FIG. 23 shows example timings of signals related to embodiment shown in FIG. 22.

During scan test operation the gtpCLK pulses for Port A & port B arrive in succession. During the gtpCLK pulse for port A the MUX_SEL signal is in a state to allow SI_A state to be transmitted to SI and with D, Q & QA latch transparent the SI_A state is propagated to SO_A. During the subsequent gtpCLK pulse for port B the MUX_SEL signal is in a state to allow SI_B state to be transmitted to SI and with D, Q & QB latches transparent the SI_B state is propagated to SO_B. In this manner by sharing a few latches between the two ports it is possible to implement the scan chain for both the ports. FIG. 23 shows example timings of the signals used in the embodiment shown in FIG. 22.

Figure 24:
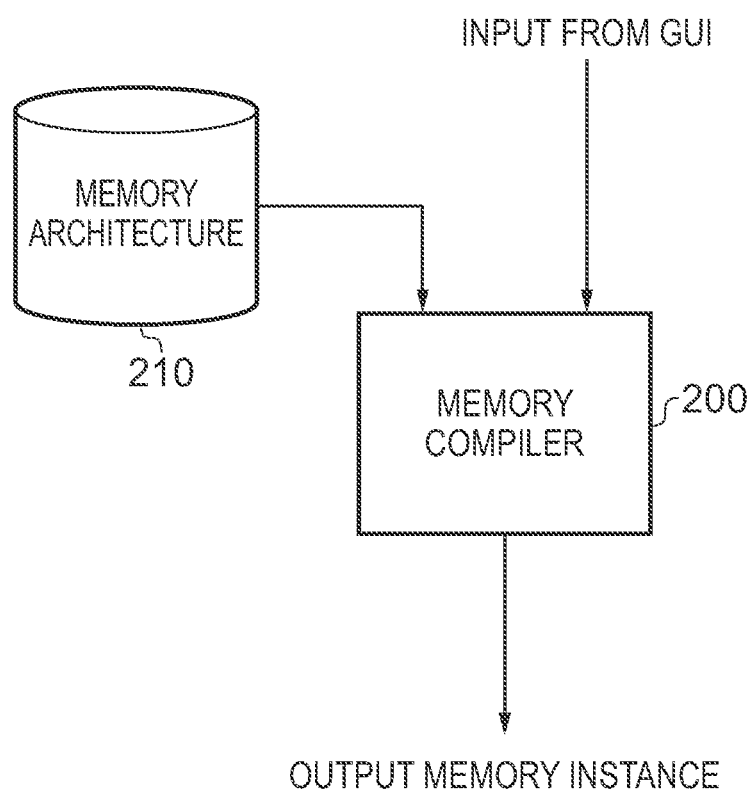
FIG. 24 is a diagram schematically illustrating the operation of a memory compiler to generate a memory instance for a memory device in accordance with embodiments.

FIG. 24 schematically illustrates how a memory instance may be created from a memory compiler 200 with reference to a memory architecture 210, as part of the process to provide a memory device in accordance with the above described embodiments. The memory architecture 210 specifies a definition of circuit elements and data defining rules for combining those circuit elements in order to create a memory instance. Particular requirements for the memory instance are entered into the memory compiler 200 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc. The memory compiler 200 then generates the required memory instance based on the input parameters and the memory architecture 210. For example, in accordance with one embodiment, the memory compiler is configured to output a memory instance in which one or more single ported SRAM banks are adapted for double-polled double-pumped operation by the provision of additional circuitry in accordance with the present techniques and as illustrated in the preceding figures.

Figure 25:
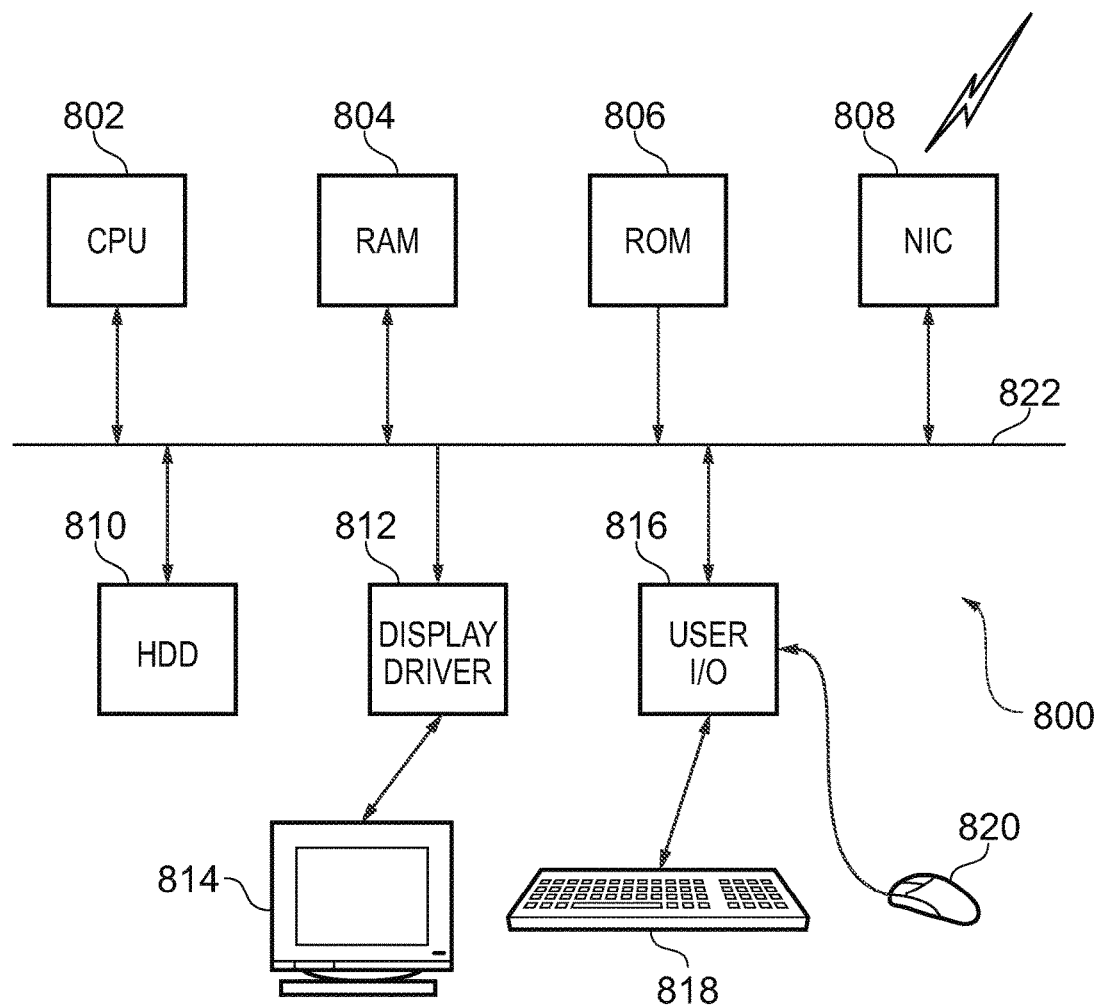
FIG. 25 is a diagram of a computer system providing a platform for a memory compiler which can generate a memory instance for a memory device in accordance with embodiments.

FIG. 25 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via, a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could Vary considerably and FIG. 25 is only one example.

Viewed from a first aspect, the present techniques provide a memory device comprising:

global control circuitry configured to receive a clock signal for the memory device, the memory device configured to perform a double memory access in response to a single edge of the clock signal, wherein the memory device is configured to generate a first internal clock pulse for a first access of the double memory access and a second internal clock pulse for a second access of the double memory access in response to the single edge of the clock signal, wherein the global control circuitry is configured to generate a comparison signal in dependence on a comparison between a first bank indicated by the first access and a second bank indicated by the second access, and wherein the local bank control circuitry of the second bank is configured to generate the second internal clock pulse in dependence on the comparison signal.

The present techniques recognise that when a double memory access is performed in response to a single edge (e.g. the rising edge) of a clock signal the memory device can be made faster and more efficient by comparing the respective banks indicated by the first and second accesses of that double memory access. In particular, where the second access of the double memory access take place response to a second internal clock pulse generated in response to a single edge of the clock signal, it has been recognised that the timing of the second internal clock pulse can, under certain circumstances, be brought forward in dependence of the outcome of the comparison. Bringing the timing of the second internal clock pulse forward enables the memory device to carry out the double memory access faster.

In some embodiments the memory device comprises a plurality of banks, each bank having associated local bank control circuitry. A configuration in which memory device has more than one bank can benefit from the present techniques, in particular because the generation of the second internal clock pulse could then be dependent on each bank in the memory device individually confirming that it is ready after the first access of the double memory access. This results from the fact that the first access of the double memory access could take place in any of the plurality of banks and a typical prior configuration has therefore been to combine the confirmation signals (e.g. reset signals) from each bank in a logical OR and to then generate the second internal clock pulse based on the output of this logical OR. However, the present techniques recognise that this can result in undesirable delay, in particular in the situation where the bank accessed by the first access the double memory access is furthest from the control circuitry which generates the second internal clock pulse. Indeed, in the situation where the bank accessed by the second access of the double memory access is also in the bank furthest from this control circuitry, the path over which the signals required to generate the second internal pulse travel will run from that furthest bank to the control circuitry and back to the furthest bank. However, by generating the second internal clock pulse in dependence on the comparison between the first bank indicated by the first access and the second bank indicated by the second access, use of this path may be avoided.

In some embodiments the local bank control circuitry of the second bank is configured to generate a first edge of the second internal clock pulse in dependence on a reset signal generated by the local bank control circuitry of the first bank and without dependence on signals generated by local bank control circuitry of banks of the plurality of banks which are not the first bank, if the comparison signal indicates that the first bank indicated matches the second bank indicated. Hence when the first bank and the second bank are the same the present techniques recognise that the reset signal generated in the first bank is sufficient to allow the second access to proceed and accordingly delays associated with further incorporating signals (e.g. other reset signals) from any other banks can be avoided. The first edge of the second internal clock pulse can thus simply be triggered by the reset signal generated by the local bank control circuitry of the one bank in which both accesses are occurring and in particular the second access may more swiftly follow the first access.

In some embodiments the reset signal generated by the local bank control circuitry of the first bank comprises a second edge of the first internal clock pulse generated by the local bank control circuitry of the first bank. Each local bank control may signal its readiness following the first access in a variety of ways, but the second (e.g. falling) edge of the first internal clock pulse represents the conclusion of the first access and therefore the most prompt indication of the readiness of the first bank to perform the second access.

In some embodiments the local bank control circuitry of the first bank is configured to generate the first edge of the second internal clock pulse after a predetermined delay after the second edge of the first internal clock pulse. A predetermined delay between the conclusion of the first access and initiating the second access (in the same bank) can thus be provided to allow sufficient time (including margin) for circuitry to reset.

In some embodiments the local bank control circuitry of the second bank is configured to generate a first edge of the second internal clock pulse in dependence on the single edge of the clock signal and without dependence on signals generated by local bank control circuitry of any banks of the plurality of banks, if the comparison signal indicates that the first bank indicated does not match the second bank indicated. The present techniques recognise that where the first bank and the second bank are not the same, i.e. the first access is to a different bank to the second access, the timing delay associated with gathering signals from different bank can be avoided, since the second access does not in act require the first access to be fully complete before it can commence.

In some embodiments the local bank control circuitry of the second bank is configured to generate the first edge of the second internal clock pulse without dependence on reset signals generated by local bank control circuitry of banks of the plurality of banks which are not the second bank. The second bank may be configured to perform its independent generation of its second internal clock pulse in a variety of ways, but performing this generation independently of other banks' reset signals is particularly beneficial for avoiding long delay paths.

In some embodiments the local bank control circuitry of the second bank is configured to generate the first edge of the second internal clock pulse after a predetermined delay after the single edge of the clock signal. Since the dependency on the conclusion of the first access is thus recognised to be unnecessary, the timing of the second internal clock pulse and instead depend on the single edge of the clock signal which initiates both accesses of the double memory access. The predetermined delay can be set in dependence on the particular system requirements to determine when a second access, which does not have to wait for the conclusion of the first access, can be initiated.

In some embodiments the predetermined delay is set such that the first edge of the second internal clock pulse precedes the second edge of the first internal clock pulse. In other words the first internal clock pulse and the second internal clock pulse can overlap.

In some embodiments the global control circuitry is configured to receive a first access enable indication and a second access enable signal and, when the first access enable indication indicates that the first access is not enabled, to generate the comparison signal indicating that the first bank indicated does not match the second bank indicated. Where the first access is not enabled it is recognised that the second access can be initiated without any dependency on the first access and this corresponds to the situation in which the first and second accesses are in different banks. Configuring the global control circuitry to produce a 'no match' signal when the first access is not enabled thus efficiently allows an accelerated initiation of the second access to take place.

In some embodiments the global control circuitry is configured to receive a first access enable indication and a second access enable signal and, when the second access enable indication indicates that the second access is not enabled, to suppress generation of the second internal clock pulse. In situations in which the second access is not required there is then no need for the second internal clock pulse to be generated.

In some embodiments the memory device comprises:

global reset signal generation circuitry configured to generate a global reset signal for the memory device, wherein the memory device is configured to generate the second internal clock pulse after an edge of the global reset signal; and one or more banks, wherein the memory device is configured such that only one bank of the one or more banks can be accessed at a time, wherein the global reset signal generation circuitry comprises, for each bank of the one or more banks, a combination logic circuitry block, the combination circuitry logic block having a local reset input, a concatenation input, a first concatenation output node and a second concatenation output node, wherein each combination logic circuitry block of the one or more banks is coupled to only one output path and only one of the first concatenation output node and the second concatenation output node has a functional connection and the functional connection is to the only one output path, wherein if the memory device has only one bank, the output path is connected to the first concatenation output node and provides the global reset signal for the memory device, and wherein if the memory device has more than one bank, the combination logic circuitry blocks for each bank of the more than one bank are connected in a concatenation and the output path from a last combination logic circuitry block in the concatenation provides the global reset signal for the memory device.

The present techniques recognise that where a global reset signal for the memory device needs to be generated in dependence on a local reset in each bank of the memory device, the timing of this global reset signal is critical to the operation of the memory device. For example the global reset signal can be used to trigger the second internal clock pulse (initiating the second access of a double memory access) and to determine a multiplexer selection signal such that an input for the first access is switched over to an input for the second access. A global reset generation circuitry thus comprises a critical path for the cycle time of the memory device. Previously the local reset signal from each bank of the memory device has been buffered in that bank and combined with the local reset signals from other banks of the memory device in a final combination stage (e.g. by a multiple input (N)AND gate) in order to generate the global reset signal. Local reset signals can thus be required to cross the whole memory instance (and hence the need to buffer each local reset signal). The present techniques recognise that such configurations can result in significant delay for the generation of the global reset signal, due to both the long wire propagation delay and the use of multiple input combination gate (e.g. NAND4 for a four bank memory instance).

The provision of the combination logic circuitry block in each bank present in the memory device enables the global reset signal to be generated with less delay and with only a single global line. Multiple paths traversing the memory device (carrying the local reset signals) are avoided and the metal line capacitance is limited from that of the connection from one bank to the next (and finally to the global reset signal generation circuitry). Slew rate variation is also reduced as a result. Moreover, the fact that the combination logic circuitry block has the same internal configuration (i.e. other than its connections) in each bank facilitates the implementation of the present techniques in the context of generating the layout of the memory device. Only one circuit cell needs to be provided to the layout tools, and the scalability and programmability of this circuit cell then enables it to be reused and reconfigured for as many instances are required in the memory device. The circuit cell itself is advantageously compact in area because of the simple logic gates and the single routing track.

In some embodiments the memory device has only one bank and the local reset input is coupled to a local reset signal generated in the bank and the concatenation input is tied to a fixed input value. For example, this fixed input value may be a logical value of zero. The local reset signal from the one bank can thus be propagated as the global reset signal.

In some embodiments the memory device has more than one bank and for a first combination logic circuitry block in the concatenation the local reset input is coupled to a local reset signal generated in a first bank comprising a first combination logic circuitry block in the concatenation and the concatenation input is tied to a fixed input value. For example, this fixed input value may be a logical value of one. The local reset signal from the first bank in the concatenation can thus be propagated to be combined with the local reset signal in the next bank in the concatenation.

In some embodiments the memory device has two banks and for a second combination logic circuitry block in the concatenation the concatenation input is connected to the second concatenation output node of the first combination logic circuitry block in the concatenation. Thus when two (or more) banks are present in the memory device, the second bank in the concatenation can thus receive the output of the first bank for combination and, where more than two banks are present, further propagation.

In some embodiments the memory device has more than two banks and a connection forming the concatenation between each combination logic circuitry block in the concatenation is alternately:

from the second concatenation output node of a previous combination logic circuitry block in the concatenation to the concatenation input of a next combination logic circuitry block in the concatenation; and from the first concatenation output node of the previous combination logic circuitry block in the concatenation to the concatenation input of the next combination logic circuitry block in the concatenation. The concatenation of combination logic circuitry blocks thus has an advantageously straightforward configuration in which odd-numbered blocks (other than the first block) in the concatenation have the same configuration and in which even-numbered blocks in the concatenation the same configurations, facilitating the implementation of the present techniques.

In some embodiments for the combination logic circuitry block of each bank of the one or more banks:

the local reset input is connected to an input of an inverter and to a first input of a NAND gate;

an output of the inverter provides a first input to a NOR gate;

the concatenation input provides a second input of the NAND gate and the second input of the NOR gate; and either the output of the NOR gate is connected to the first concatenation output node or the output of the NAND gate is connected to the second concatenation output. node to provide the functional connection to the only one output path. The use of NAND and NOR gates can be beneficial to the overall compactness of the layout due to the relative compactness of each of these types of gate.

In some embodiments the memory device further comprises a multiplexer configured to output a selected address of a first address of the first access and a second address of the second access in dependence on a selection signal and to provide the selected address for a respective access of the double memory access, wherein the selection signal is configured to toggle after the global reset signal toggles. The timing of the selection signal can thus be such that the second address for the second access is only provided once the toggling of the global reset signal indicates that all banks in the memory device have asserted their local reset signal.

In some embodiments the memory device comprises a single-ported bank and wherein the global control circuitry further comprises:

a multiplexer configured to receive a first data item for the first access and a second data item for the second access and is configured to output the first data item when a multiplexer selection signal has a first value and the second data item when the multiplexer selection signal has a second value;

a latch configured to receive the second data item and to provide the second data item to the multiplexer in dependence on a latch clock; and latch clock generation circuitry configured to generate the latch clock in dependence on the clock signal and the multiplexer selection signal.

Where the memory device comprises a single-ported bank, it is recognised that where a double memory access is to be carried out, provision must be made for the relevant inputs for the first and second access to be provided sequentially to the single-ported bank. The multiplexer provides this functionality according to the present techniques, the multiplexer being configured to receive first and second data items (which could be data values or address values). The second data item must therefore be held whilst the first data item is propagated. Previously this holding of the second data item has been provided by a flip-flop, which can hold the second data item for a full clock cycle. However the present techniques recognise that the use of a flip-flop is preferably avoided since the use of these components is typically rather costly in terms of area, as the larger area associated with each flip-flop scales up significantly for the memory device due to the large number of input pins that a contemporary memory device typically has. Instead, the present techniques make use of a single latch in order to hold the second data item. In order to do this the latch clock which controls the latch is adapted so that the second data item is held only as long as is strictly required, namely until the first data item as being propagated by the multiplexer to the single-ported bank, by generating the latch clock to be dependent on both the clock signal and the multiplexer selection signal. This enables only a single latch to be used at the input to the multiplexer, resulting in area saving for the memory instance.

In some embodiments the latch clock generation circuitry is configured to generate a first edge of the latch clock in response to the single edge of the clock signal. The first edge of the latch clock may be used to set up the latch to hold the second data item, and accordingly efficient configuration is provided if this is done directly in response to the single edge of the clock signal. Note therefore that the generation of the first edge of the latch clock will not depend on the multiplexer selection signal in these embodiments.

In some embodiments the latch clock generation circuitry is configured to generate a second edge of the latch clock in response to the multiplexer selection signal switching from the first value to the second value. This dependency of the second edge of the latch clock on the multiplexer selection signal thus means that the second value is latched until the multiplexer selection signal makes this transition. Moreover, by appropriate choice of the first and second value (i.e. to choose a particular edge of the multiplexer selection signal) the timing of the matching of the second value can be such that only once the multiplexer selection signal returns to indicating selection of the first value will latching of the second value end.

In some embodiments the latch clock generation circuitry is configured to generate the second edge of the latch clock after a first edge of the second internal clock pulse. The first edge of the second internal clock pulse is typically used to initiate the second access and this configuration ensures that the latching the second value is maintained until the second access has started.

In some embodiments the memory device further comprises multiplexer selection signal generation circuitry configured to generate the multiplexer selection signal having the second value a predetermined delay after a first edge of the first internal clock pulse. This predetermined delay can be chosen in dependence on the particular system configurations and requirements in order to allow for setup and so on.

In some embodiments the multiplexer selection signal generation circuitry is configured to return the multiplexer selection signal to having the first value a predetermined delay after a first edge of the second internal clock pulse. Hence once the second access has been initiated by the first edge of the second internal clock pulse the multiplexer may be configured to propagate a first value again (although of course this 'first value' may be different to the previous 'first value').

In some embodiments the global control circuitry further comprises an output latch configured to receive an output data item selected by the multiplexer and configured to provide the output data item to the single-ported bank in response to the first internal clock pulse for the first access of the double memory access and in response to the second internal clock pulse for the second access of the double memory access.

In some embodiments the output latch is configured provide the output data item to the single-ported bank in response to first edges of the first internal clock pulse and the second internal clock pulse respectively.

In some embodiments the memory device comprises more than one bank arranged in a set of banks and wherein access to the set of banks is single-ported.

In some embodiments the first data item for the first access is a first address and the second data item for the second access is a second address.

In some embodiments the memory device comprises:

single-ported data storage circuitry comprising a data output latch;

dual output latching circuitry comprising a first supplementary data output latch and a second supplementary data output latch, wherein the first supplementary data output latch and the second supplementary data output latch are each configured to receive and to latch an output of the data output latch; and dual output control circuitry configured, in response to the single edge of the clock signal, to cause the output of the data latch to be latched by the first supplementary data output latch and subsequently to cause the output of the data latch to be latched by the second supplementary data output latch.

In a memory device configured to perform a double memory access in response to a single edge of its clock signal, and where the memory device comprises single-ported data storage circuitry (for example a 6T SRAM bitcell), the present techniques recognise the need for a data value read during the first access to be stored so that it is not overwritten by a data value read during the second access, since both these data are output from the memory device via the same data output latch. Dual output latching circuitry having first and second supplementary data output latches is provided to latch the data output from each read and in response to the single edge of its clock signal dual output control circuitry causes the data read during the first access to be latched by the first supplementary data output latch and the data read during the second access to be latched by second supplementary data output latch. The memory device is thus able to behave as though it has two output paths but without modification to the data storage circuitry. The present techniques recognise that this configuration is advantageous over one in which an additional latch is provided within the data storage circuitry, for example at the sense amplifier level, because of the increase in capacitive loading at the sense amplifier inputs in such a configuration, thereby resulting in a higher resolution time for the sense amplifier and also increasing the systematic offsets of the sense amplifier. Moreover in the context of contemporary techniques for providing the layout of a memory device (a 'memory instance') the present techniques allow existing single-ported data storage circuitry to be reused and converted into a double pumped, "pseudo" dual ported memory device.

In some embodiments the single-ported data storage circuitry comprises sense amplifier circuitry configured to be active when a sense amplifier enable signal is asserted, and wherein the dual output control circuitry is configured to: activate the first supplementary data output latch in response to the single edge of the clock signal; deactivate the first supplementary data output latch and activate the second supplementary data output latch in response to a first instance of a selected type of edge of the sense amplifier enable signal which follows the single edge of the clock signal; and deactivate the second supplementary data output latch in response to a next instance of the selected type of edge of the sense amplifier enable signal. By configuring the control of the first and second supplementary data output latches (which may for example be implemented by means of a dedicated clock signal for each supplementary data output latch) in this manner the effect of adding the supplementary data output latches on the access time for the memory device is counteracted by linking the switching between the first and second supplementary data output latches to a selected edge of the sense amplifier enable signal, and hence as soon as the sensing operation for the first access is complete the switch of activation from the first to the second supplementary data output latch is made.

In some embodiments the single-ported data storage circuitry comprises sense amplifier circuitry configured to be active when a sense amplifier enable signal is asserted, wherein the dual output control circuitry is configured to generate an internal clock signal for the second supplementary data output latch, and wherein the dual output control circuitry is configured to generate a first type of edge of the internal clock signal in response to the single edge of the clock signal and a second type of edge of the internal clock signal in response to a first instance of a selected type of edge of the sense amplifier enable signal which follows the single edge of the clock signal. This internal clock signal can be used to control various aspects of the dual output latching circuitry, and it is beneficial for this internal clock signal to control the operation of the second supplementary data output latch such that any additional delay associated with the use of the dual output latch is kept as small as possible, and a tight sequence of switching to achieve this is supported by the first edge of the internal clock signal being generated by the single edge of the clock signal and the second edge of the internal clock signal being generated by an selected edge of the sense amplifier enable signal.

In some embodiments the single-ported data storage circuitry comprises a data input latch, and further comprising:

dual scan input latching circuitry configured to provide a scan input to the data input latch, the dual scan input latching circuitry comprising:

a scan input multiplexer configured to receive a first scan data value and a second scan data value, and configured to output to the data input latch the first scan data value when a scan multiplexer selection signal has a first value and the second scan data value when the multiplexer selection signal has a second value; and a scan input latch configured to receive the second scan data value and to provide the second scan data value to the scan input multiplexer in dependence on a scan input latch clock. Accordingly a scan chain can be set up for the memory device which is not limited by the single input and output to the single-ported data storage circuitry, and both paths of the pseudo-dual port memory can be tested.

In some embodiments the memory device further comprising scan input latch clock generation circuitry configured to generate a first scan pulse and a second scan pulse of the scan latch clock in response to the single edge of the clock signal, wherein the scan input latch is configured to provide the second scan data value to the scan input multiplexer in response to the second scan pulse. Each path of the pseudo-dual port memory can thus be sequentially tested.

Viewed from a second aspect the present techniques provide a method of operating a memory device comprising a plurality of banks, each bank having associated local bank control circuitry, the method comprising the steps of:

receiving a clock signal for the memory device;

generating a first internal clock pulse for a first access of a double memory access and a second internal clock pulse for a second access of the double memory access in response to a single edge of the clock signal;

generating a comparison signal in dependence on a comparison between a first bank of the plurality of backs indicated by the first access and a second bank of the plurality of banks indicated by the second access; and generating, in the local bank control circuitry of the second bank, the second internal clock pulse in dependence on the comparison signal.

Viewed from a third aspect the present techniques provide a memory device comprising:

a plurality of banks each bank having associated local bank control circuitry;

means for receiving a clock signal for the memory device;

means for generating a first internal clock pulse for a first access of a double memory access and a second internal clock pulse for a second access of the double memory access in response to a single edge of the clock signal;

means for generating a comparison signal in dependence on a comparison between a first bank of the plurality of backs indicated by the first access and a second bank of the plurality of banks indicated by the second access; and means for generating, in the local bank control circuitry of the second bank, the second internal clock pulse in dependence on the comparison signal.

Viewed from a fourth aspect there is provided a computer-readable storage medium on which are stored in a non-transient fashion computer-readable instructions configured to control a memory compiler to generate a layout instance of a memory device according to any preceding aspect.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

Various aspects and configurations of a memory device according to the present techniques are set out in the following numbered clauses:

Clause 1. A memory device comprising:

global reset signal generation circuitry configured to generate a global reset signal for the memory device; and one or more banks, wherein the memory device is configured such that only one bank of the one or more banks can be accessed at a time, wherein the global reset signal generation circuitry comprises, for each bank of the one or more banks, a combination logic circuitry block, the combination circuitry logic block having a local reset input, a concatenation input, a first concatenation output node and a second concatenation output node, wherein each combination logic circuitry block of the one or more banks is coupled to only one output path and only one of the first concatenation output node and the second concatenation output node has a functional connection and the functional connection is to the only one output path, wherein if the memory device has only one bank, the output path is connected to the first concatenation output node and provides the global reset signal for the memory device, and wherein if the memory device has more than one bank, the combination logic circuitry blocks for each bank of the more than one bank are connected in a concatenation and the output path from a last combination logic circuitry block in the concatenation provides the global reset signal for the memory device.

Clause 2. The memory device of Clause 1, wherein the memory device has only one bank and the local reset input is coupled to a local reset signal generated in the bank and the concatenation input is tied to a fixed input value.

Clause 3. The memory device of Clause 1, wherein the memory device has more than one bank and for a first combination logic circuitry block in the concatenation the local reset input is coupled to a local reset signal generated in a first bank comprising a first combination logic circuitry block in the concatenation and the concatenation input is tied to a fixed input value.

Clause 4. The memory device of Clause 3, wherein the memory device has two banks and for a second combination logic circuitry block in the concatenation the concatenation input is connected to the second concatenation output node of the first combination logic circuitry block in the concatenation.

Clause 5. The memory device of Clause 4, wherein the memory device has more than two banks and a connection forming the concatenation between each combination logic circuitry block in the concatenation is alternately:

from the second concatenation output node of a previous combination logic circuitry block in the concatenation to the concatenation input of a next combination logic circuitry block in the concatenation; and from the first concatenation output node of the previous combination logic circuitry block in the concatenation to the concatenation input of the next combination logic circuitry block in the concatenation.

Clause 6. The memory device of any of Clauses 1-5, wherein for the combination logic circuitry block of each bank of the one or more banks:

the local reset input is connected to an input of an inverter and to a first input of a NAND gate;

an output of the inverter provides a first input to a NOR gate;

the concatenation input provides a second input of the NAND gate and the second input of the NOR gate; and either the output of the NOR gate is connected to the first concatenation output node or the output of the NAND gate is connected to the second concatenation output node to provide the functional connection to the only one output path.

Clause 7. The memory device of any of Clauses 1-6, further comprising a multiplexer configured to output a selected address of a first address of the first access and a second address of the second access in dependence on a selection signal and to provide the selected address for a respective access of the double memory access, wherein the selection signal is configured to toggle after the global reset signal toggles.

Clause 8. A memory device comprising:

a single-ported bank; and global control circuitry configured to receive a clock signal for the memory device, the memory device configured to perform a double memory access in response to a single edge of the clock signal, and to generate a first internal clock pulse for a first access of the double memory access and a second internal clock pulse for a second access of the double memory access in response to the single edge of the clock signal, wherein the global control circuitry comprises:

a multiplexer configured to receive a first data item for the first access and a second data item for the second access and is configured to output the first data item when a multiplexer selection signal has a first value and the second data item when the multiplexer selection signal has a second value;

a latch configured to receive the second data item and to provide the second data item to the multiplexer in dependence on a latch clock; and latch clock generation circuitry configured to generate the latch clock in dependence on the clock signal and the multiplexer selection signal.

Clause 9. The memory device of Clause 8, wherein the latch clock generation circuitry is configured to generate a first edge of the latch clock in response to the single edge of the clock signal.

Clause 10. The memory device of Clause 8 or 9, wherein the latch clock generation circuitry is configured to generate a second edge of the latch clock in response to the multiplexer selection signal switching from the first value to the second value.

Clause 11. The memory device of Clause 10, wherein the latch clock generation circuitry is configured to generate the second edge of the latch clock after a first edge of the second internal clock pulse.

Clause 12. The memory device of any of Clauses 8-11, further comprising multiplexer selection signal generation circuitry configured to generate the multiplexer selection signal having the second value a predetermined delay after a first edge of the first internal clock pulse.

Clause 13. The memory device of Clause 12, wherein the multiplexer selection signal generation circuitry is configured to return the multiplexer selection signal to having the first value a predetermined delay after a first edge of the second internal clock pulse.

Clause 14. The memory device of any of Clauses 8-13, wherein the global control circuitry further comprises an output latch configured to receive an output data item selected by the multiplexer and configured to provide the output data item to the single-ported bank in response to the first internal clock pulse for the first access of the double memory access and in response to the second internal clock pulse for the second access of the double memory access.

Clause 15. The memory device of any of Clauses 14, wherein the output latch is configured provide the output data item to the single-ported bank in response to first edges of the first internal clock pulse and the second internal clock pulse respectively.

Clause 16. The memory device of any of Clauses 8-15, comprising more than one bank arranged in a set of banks and wherein access to the set of banks is single-ported.

Clause 17. The memory device of any of Clauses 8-16, wherein the first data item for the first access is a first address and the second data item for the second access is a second address.

Clause 18. A memory device comprising:

global control circuitry configured to receive a clock signal for the memory device, the memory device configured to perform a double memory access in response to a single edge of the clock signal;

single-ported data storage circuitry comprising a data output latch;

dual output latching circuitry comprising a first supplementary data output latch and a second supplementary data output latch, wherein the first supplementary data output latch and the second supplementary data output latch are each configured to receive and to latch an output of the data output latch; and dual output control circuitry configured, in response to the single edge of the clock signal, to cause the output of the data latch to be latched by the first supplementary data output latch and subsequently to cause the output of the data latch to be latched by the second supplementary data output latch.

Clause 19. The memory device of Clause 18, wherein the single-ported data storage circuitry comprises sense amplifier circuitry configured to be active when a sense amplifier enable signal is asserted, and wherein the dual output control circuitry is configured to:

activate the first supplementary data output latch in response to the single edge of the clock signal;

deactivate the first supplementary data output latch and activate the second supplementary data output latch in response to a first instance of a selected type of edge of the sense amplifier enable signal which follows the single edge of the clock signal; and deactivate the second supplementary data output latch in response to a next instance of the selected type of edge of the sense amplifier enable signal.

Clause 20. The memory device of Clause 18, wherein the single-ported data storage circuitry comprises sense amplifier circuitry configured to be active when a sense amplifier enable signal is asserted, wherein the dual output control circuitry is configured to generate an internal clock signal for the second supplementary data output latch, and wherein the dual output control circuitry is configured to generate a first type of edge of the internal clock signal in response to the single edge of the clock signal and a second type of edge of the internal clock signal in response to a first instance of a selected type of edge of the sense amplifier enable signal which follows the single edge of the clock signal.

Clause 21. The memory device of any of Clauses 18-20, wherein the single-ported data storage circuitry comprises a data input latch, and further comprising:

dual scan input latching circuitry configured to provide a scan input to the data input latch, the dual scan input latching circuitry comprising:

a scan input multiplexer configured to receive a first scan data value and a second scan data value, and configured to output to the data input latch the first scan data value when a scan multiplexer selection signal has a first value and the second scan data value when the multiplexer selection signal has a second value; and a scan input latch configured to receive the second scan data value and to provide the second scan data value to the scan input multiplexer in dependence on a scan input latch clock.

Clause 22. The memory device of Clause 21, wherein the memory device further comprising scan input latch clock generation circuitry configured to generate a first scan pulse and a second scan pulse of the scan latch clock in response to the single edge of the clock signal, wherein the scan input latch is configured to provide the second scan data value to the scan input multiplexer in response to the second scan pulse.

The invention claimed is:

1. A memory device comprising:
    global control circuitry configured to receive a clock signal for the memory device, the memory device being configured to perform a double memory access in response to a single edge of the clock signal, and
    a plurality of banks, each bank having associated local bank control circuitry,
    wherein the memory device is further configured to generate a first internal clock pulse for a first access of the double memory access and a second internal clock pulse for a second access of the double memory access in response to the single edge of the clock signal,
    wherein the global control circuitry is further configured to generate a comparison signal in dependence on a comparison between a first bank indicated by the first access and a second bank indicated by the second access, and
    wherein a local bank control circuitry of the second bank is configured to generate the second internal clock pulse in dependence on the comparison signal, and
    wherein the local bank control circuitry of the second bank is further configured to generate a first edge of the second internal clock pulse in dependence on a reset signal generated by the local bank control circuitry of the second bank and without dependence on signals generated by local bank control circuitry of banks of the plurality of banks which are not the second bank, if the comparison signal indicates that the first bank indicated matches the second bank indicated.

2. The memory device of claim 1, wherein the reset signal generated by the local bank control circuitry of the second bank comprises an edge of the first internal clock pulse generated by the local bank control circuitry of the second bank.

3. The memory device of claim 2, wherein the local bank control circuitry of the second bank is further configured to generate the first edge of the second internal clock pulse after a predetermined delay after the edge of the first internal clock pulse.

4. The memory device of claim 1, wherein the local bank control circuitry of the second bank is further configured to generate the first edge of the second internal clock pulse without dependence on reset signals generated by local bank control circuitry of banks of the plurality of banks which are not the second bank.

5. The memory device of claim 1, wherein the local bank control circuitry of the second bank is further configured to generate the first edge of the second internal clock pulse in dependence on the single edge of the clock signal and without dependence on signals generated by local bank control circuitry of any banks of the plurality of banks, if the comparison signal indicates that the first bank indicated does not match the second bank indicated.

6. The memory device of claim 5, wherein the local bank control circuitry of the second bank is further configured to generate the first edge of the second internal clock pulse after a predetermined delay after the single edge of the clock signal.

7. The memory device of claim 6, wherein the predetermined delay is set such that the first edge of the second internal clock pulse precedes the second edge of the first internal clock pulse.

8. The memory device of claim 5, wherein the global control circuitry is further configured to receive a first access enable indication and a second access enable signal and, when the first access enable indication indicates that the first access is not enabled, to generate the comparison signal indicating that the first bank indicated does not match the second bank indicated.

9. The memory device of claim 1, wherein the global control circuitry is further configured to receive a first access enable indication and a second access enable signal and, when the second access enable indication indicates that the second access is not enabled, to suppress generation of the second internal clock pulse.

10. A memory device comprising:
    global control circuitry configured to receive a clock signal for the memory device, the memory device being configured to perform a double memory access in response to a single edge of the clock signal;
    global reset signal generation circuitry configured to generate a global reset signal for the memory device, wherein the memory device is further configured to generate the second internal clock pulse after an edge of the global reset signal; and
    one or more banks, wherein the memory device is further configured such that only one bank of the one or more banks can be accessed at a time,
    wherein the memory device is further configured to generate a first internal clock pulse for a first access of the double memory access and a second internal clock pulse for a second access of the double memory access in response to the single edge of the clock signal,
    wherein the global control circuitry is further configured to generate a comparison signal in dependence on a comparison between a first bank indicated by the first access and a second bank indicated by the second access,
    wherein a local bank control circuitry of the second bank is configured to generate the second internal clock pulse in dependence on the comparison signal,
    wherein the global reset signal generation circuitry comprises, for each bank of the one or more banks, a combination logic circuitry block, the combination circuitry logic block having a local reset input, a concatenation input, a first concatenation output node and a second concatenation output node,
    wherein each combination logic circuitry block of the one or more banks is coupled to only one output path and only one of the first concatenation output node and the second concatenation output node has a functional connection and the functional connection is to the only one output path,
    wherein if the memory device has only one bank, the output path is connected to the first concatenation output node and provides the global reset signal for the memory device,
    and wherein if the memory device has more than one bank, the combination logic circuitry blocks for each bank of the more than one bank are connected in a concatenation and the output path from a last combination logic circuitry block in the concatenation provides the global reset signal for the memory device.

11. The memory device of claim 10, wherein the memory device has the only one bank and the local reset input is coupled to a local reset signal generated in the only one bank and the concatenation input is tied to a fixed input value.

12. The memory device of claim 10, wherein the memory device has the more than one bank and for a first combination logic circuitry block in the concatenation the local reset input is coupled to a local reset signal generated in a first bank comprising a first combination logic circuitry block in the concatenation and the concatenation input is tied to a fixed input value.

13. The memory device of claim 12, wherein the memory device has two banks and for a second combination logic circuitry block in the concatenation the concatenation input is connected to the second concatenation output node of the first combination logic circuitry block in the concatenation.

14. The memory device of claim 13, wherein the memory device has more than two banks and a connection forming the concatenation between each combination logic circuitry block in the concatenation is alternately:
from the second concatenation output node of a previous combination logic circuitry block in the concatenation to the concatenation input of a next combination logic circuitry block in the concatenation; and
from the first concatenation output node of the previous combination logic circuitry block in the concatenation to the concatenation input of the next combination logic circuitry block in the concatenation.

15. The memory device of claim 10, wherein for the combination logic circuitry block of each bank of the one or more banks:
the local reset input is connected to an input of an inverter and to a first input of a NAND gate;
an output of the inverter provides a first input to a NOR gate;
the concatenation input provides a second input of the NAND gate and the second input of the NOR gate; and
either the output of the NOR gate is connected to the first concatenation output node or the output of the NAND gate is connected to the second concatenation output node to provide the functional connection to the only one output path.

16. The memory device of claim 10, further comprising a multiplexer configured to output a selected address of a first address of the first access and a second address of the second access in dependence on a selection signal and to provide the selected address for a respective access of the double memory access, wherein the selection signal is configured to toggle after the global reset signal toggles.

17. The memory device as claimed in claim 1, further comprising a single-ported bank and wherein the global control circuitry further comprises:
a multiplexer configured to:
receive a first data item for the first access;
receive a second data item for the second access;
output the first data item when a multiplexer selection signal has a first value; and
output the second data item when the multiplexer selection signal has a second value;
a latch configured to receive the second data item and to provide the second data item to the multiplexer in dependence on a latch clock; and
latch clock generation circuitry configured to generate the latch clock in dependence on the clock signal and the multiplexer selection signal.

18. The memory device of claim 17, wherein the latch clock generation circuitry is further configured to generate a first edge of the latch clock in response to the single edge of the clock signal.

19. The memory device of claim 17, wherein the latch clock generation circuitry is further configured to generate a second edge of the latch clock in response to the multiplexer selection signal switching from the first value to the second value.

20. The memory device of claim 19, wherein generating the second edge of the latch clock occurs after a first edge of the second internal clock pulse.

21. The memory device of claim 17, further comprising multiplexer selection signal generation circuitry configured to generate the multiplexer selection signal having the second value a predetermined delay after a first edge of the first internal clock pulse.

22. The memory device of claim 21, wherein the multiplexer selection signal generation circuitry is further configured to return the multiplexer selection signal to having the first value a predetermined delay after a first edge of the second internal clock pulse.

23. The memory device of claim 17, wherein the global control circuitry further comprises an output latch configured to receive an output data item selected by the multiplexer and configured to provide the output data item to the single-ported bank in response to the first internal clock pulse for the first access of the double memory access and in response to the second internal clock pulse for the second access of the double memory access.

24. The memory device of claim 23, wherein the output latch is configured provide the output data item to the single-ported bank in response to first edges of the first internal clock pulse and the second internal clock pulse respectively.

25. The memory device of claim 17, comprising more than one bank arranged in a set of banks, wherein the more than one bank includes the single-ported bank, and wherein access to the set of banks is single-ported.

26. The memory device of claim 17, wherein the first data item for the first access is a first address and the second data item for the second access is a second address.

27. The memory device of claim 1, further comprising:
single-ported data storage circuitry comprising a data output latch;
dual output latching circuitry comprising a first supplementary data output latch and a second supplementary data output latch, wherein the first supplementary data output latch and the second supplementary data output latch are each configured to receive and to latch an output of the data output latch; and
dual output control circuitry configured, in response to the single edge of the clock signal, to cause the output of the data latch to be latched by the first supplementary data output latch and subsequently to cause the output of the data latch to be latched by the second supplementary data output latch.

28. The memory device of claim 27, wherein the single-ported data storage circuitry further comprises sense amplifier circuitry configured to be active when a sense amplifier enable signal is asserted, and wherein the dual output control circuitry is further configured to:
activate the first supplementary data output latch in response to the single edge of the clock signal;
deactivate the first supplementary data output latch and activate the second supplementary data output latch in response to a first instance of a selected type of edge of the sense amplifier enable signal which follows the single edge of the clock signal; and
deactivate the second supplementary data output latch in response to a next instance of the selected type of edge of the sense amplifier enable signal.

29. The memory device of claim 27, wherein the single-ported data storage circuitry further comprises sense amplifier circuitry configured to be active when a sense amplifier enable signal is asserted, and wherein the dual output control circuitry is configured to:
generate an internal clock signal for the second supplementary data output latch;
generate a first type of edge of the internal clock signal in response to the single edge of the clock signal; and
generate a second type of edge of the internal clock signal in response to a first instance of a selected type of edge of the sense amplifier enable signal which follows the single edge of the clock signal.

30. The memory device of claim 27, wherein the single-ported data storage circuitry further comprises:
a data input latch; and
dual scan input latching circuitry configured to provide a scan input to the data input latch, the dual scan input latching circuitry comprising:
a scan input multiplexer configured to:
receive a first scan data value and a second scan data value;
output, to the data input latch, the first scan data value when a scan multiplexer selection signal has a first value; and
output, to the data input latch, the second scan data value when the scan multiplexer selection signal has a second value; and
a scan input latch configured to receive the second scan data value and to provide the second scan data value to the scan input multiplexer in dependence on a scan input latch clock.

31. The memory device of claim 30, wherein the memory device further comprising scan input latch clock generation circuitry configured to generate a first scan pulse and a second scan pulse of the scan latch clock in response to the single edge of the clock signal,
wherein the scan input latch is further configured to provide the second scan data value to the scan input multiplexer in response to the second scan pulse.

32. A method of operating a memory device comprising a plurality of banks, each bank having associated local bank control circuitry, the method comprising:
receiving a clock signal for the memory device;
generating a first internal clock pulse for a first access of a double memory access and a second internal clock pulse for a second access of the double memory access in response to a single edge of the clock signal;
generating a comparison signal in dependence on a comparison between a first bank of the plurality of banks indicated by the first access and a second bank of the plurality of banks indicated by the second access;
generating, in the local bank control circuitry of the second bank, the second internal clock pulse in dependence on the comparison signal; and
generating a first edge of the second internal clock pulse in dependence on a reset signal generated by the local bank control circuitry of the second bank and without dependence on signals generated by local bank control circuitry of banks of the plurality of banks which are not the second bank, if the comparison signal indicates that the first bank indicated matches the second bank indicated.

33. A memory device comprising:
a plurality of banks each bank having associated local bank control circuitry;
means for receiving a clock signal for the memory device;
means for generating a first internal clock pulse for a first access of a double memory access and a second internal clock pulse for a second access of the double memory access in response to a single edge of the clock signal;
means for generating a comparison signal in dependence on a comparison between a first bank of the plurality of banks indicated by the first access and a second bank of the plurality of banks indicated by the second access; and
means for generating, in the local bank control circuitry of the second bank, the second internal clock pulse in dependence on the comparison signal, and
means for generating a first edge of the second internal clock pulse in dependence on a reset signal generated by the local bank control circuitry of the second bank and without dependence on signals generated by local bank control circuitry of banks of the plurality of banks which are not the second bank, if the comparison signal indicates that the first bank indicated matches the second bank indicated.

* * * * *